US011128268B1

(12) United States Patent
Kishore et al.

(10) Patent No.: US 11,128,268 B1
(45) Date of Patent: Sep. 21, 2021

(54) POWER AMPLIFIER PACKAGES CONTAINING PERIPHERALLY-ENCAPSULATED DIES AND METHODS FOR THE FABRICATION THEREOF

(71) Applicant: NXP USA, Inc., Austin, TX (US)

(72) Inventors: Sharan Kishore, Tempe, AZ (US); Jaynal A. Molla, Gilbert, AZ (US); Lakshminarayan Viswanathan, Phoenix, AZ (US); Tianwei Sun, Chandler, AZ (US); David James Dougherty, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 1 day.

(21) Appl. No.: 16/885,525

(22) Filed: May 28, 2020

(51) Int. Cl.
H01L 23/34 (2006.01)
H03F 3/195 (2006.01)
H01L 23/66 (2006.01)
H03F 3/213 (2006.01)
H03F 3/24 (2006.01)

(52) U.S. Cl.
CPC ............ H03F 3/195 (2013.01); H01L 23/66 (2013.01); H03F 3/213 (2013.01); H03F 3/245 (2013.01); H03F 2200/451 (2013.01)

(58) Field of Classification Search
CPC ............................... H01L 23/34; H01L 21/00
USPC .................................................. 257/735, 676
See application file for complete search history.

(56) References Cited

U.S. PATENT DOCUMENTS

| 5,450,283 | A | 9/1995 | Lin et al. |
| 7,900,521 | B2 | 3/2011 | Hooper et al. |
| 8,803,302 | B2 | 8/2014 | Viswanathan et al. |
| 9,214,440 | B1 | 12/2015 | Zhang et al. |
| 9,510,495 | B2 | 11/2016 | Hooper et al. |
| 9,799,580 | B2 | 10/2017 | Li et al. |
| 9,847,317 | B2 | 12/2017 | Yu et al. |
| 2012/0094442 | A1* | 4/2012 | Lin ..................... H05K 1/021 438/118 |
| 2014/0124926 | A1 | 5/2014 | Reichman |
| 2017/0271175 | A1 | 9/2017 | Healy et al. |
| 2017/0278763 | A1 | 9/2017 | Li et al. |
| 2019/0206753 | A1* | 7/2019 | Gaines ................ H01L 23/562 |
| 2019/0333895 | A1* | 10/2019 | Kim ..................... H01L 24/86 |

FOREIGN PATENT DOCUMENTS

WO 2018026239 A1 2/2018

* cited by examiner

Primary Examiner — Henry Choe

(57) ABSTRACT

Power amplifier (PA) packages containing peripherally-encapsulated dies are provided, as are methods for fabricating such PA packages. In embodiments, a method for fabricating a PA package includes obtaining a die-substrate assembly containing a radio frequency (RF) power die, a package substrate, and a die bond layer. The die bond layer is composed of at least one metallic constituent and electrically couples a backside of the RF power die to the package substrate. A peripheral encapsulant body is formed around the RF power die and covers at least a portion of the die bond layer, while leaving at least a majority of a frontside of the RF power die uncovered. Before or after forming the peripheral encapsulant body, terminals of the PA package are interconnected with the RF power die; and a cover piece is bonded to the die-substrate assembly to enclose a gas-containing cavity within the PA package.

20 Claims, 13 Drawing Sheets

US 11,128,268 B1

POWER AMPLIFIER PACKAGES CONTAINING PERIPHERALLY-ENCAPSULATED DIES AND METHODS FOR THE FABRICATION THEREOF

TECHNICAL FIELD

Embodiments of the present disclosure relate generally to microelectronics and, more particularly, to power amplifier packages containing peripherally-encapsulated dies, as well as to methods for fabricating such power amplifier packages.

ABBREVIATIONS

Abbreviations appearing relatively infrequently in this document are defined upon initial usage, while abbreviations appearing more frequently in this document are defined below:
CTE—coefficient of thermal expansion;
FET—field effect transistor;
PA—power amplifier;
RF—radio frequency; and
SMD—surface mount device.

BACKGROUND

A PA package contains at least one semiconductor die bearing a transistor integrated circuit, which is utilized for RF signal or power amplification purposes; herein, an "RF power die." In the case of a Doherty PA package, for example, at least one carrier RF power die and at least one peaking RF power die are contained within the body of the PA package. The carrier and peaking RF power dies may be mounted to an electrically-conductive substrate, such as a metallic base flange, which provides electrical contact to the respective backsides of the dies, while also serving as a heatsink. In certain cases, the PA package may contain an air cavity, which is enclosed by a lid or cover piece; the term "air cavity" referring to a sealed, gas-containing cavity by industry convention. In other instances, a PA package may be fabricated to lack such an air cavity and, instead, to contain a void-free encapsulant body in which the packaged dies, any other packaged components (e.g., SMDs), and internal interconnect features (e.g., bond wires) are embedded. PA package of this latter type are commonly referred to as "encapsulated," "overmolded," or "plastic" packages, with the term "overmolded" principally used herein. Relative to air cavity PA packages, overmolded PA packages are typically less costly to manufacture and may have an increased structural robustness in certain respects. Conversely, air cavity PA packages tend to provide superior RF performance, particularly at higher frequencies approaching or exceeding 3 Gigahertz, relative to overmolded PA packages. In summary, then, these common PA package types are each associated with various benefits and shortcomings, as are most, if not all existing package constructions suitable for usage in the manufacture of PA packages.

BRIEF DESCRIPTION OF THE DRAWINGS

At least one example of the present invention will hereinafter be described in conjunction with the following figures, wherein like numerals denote like elements.

Figure 1:
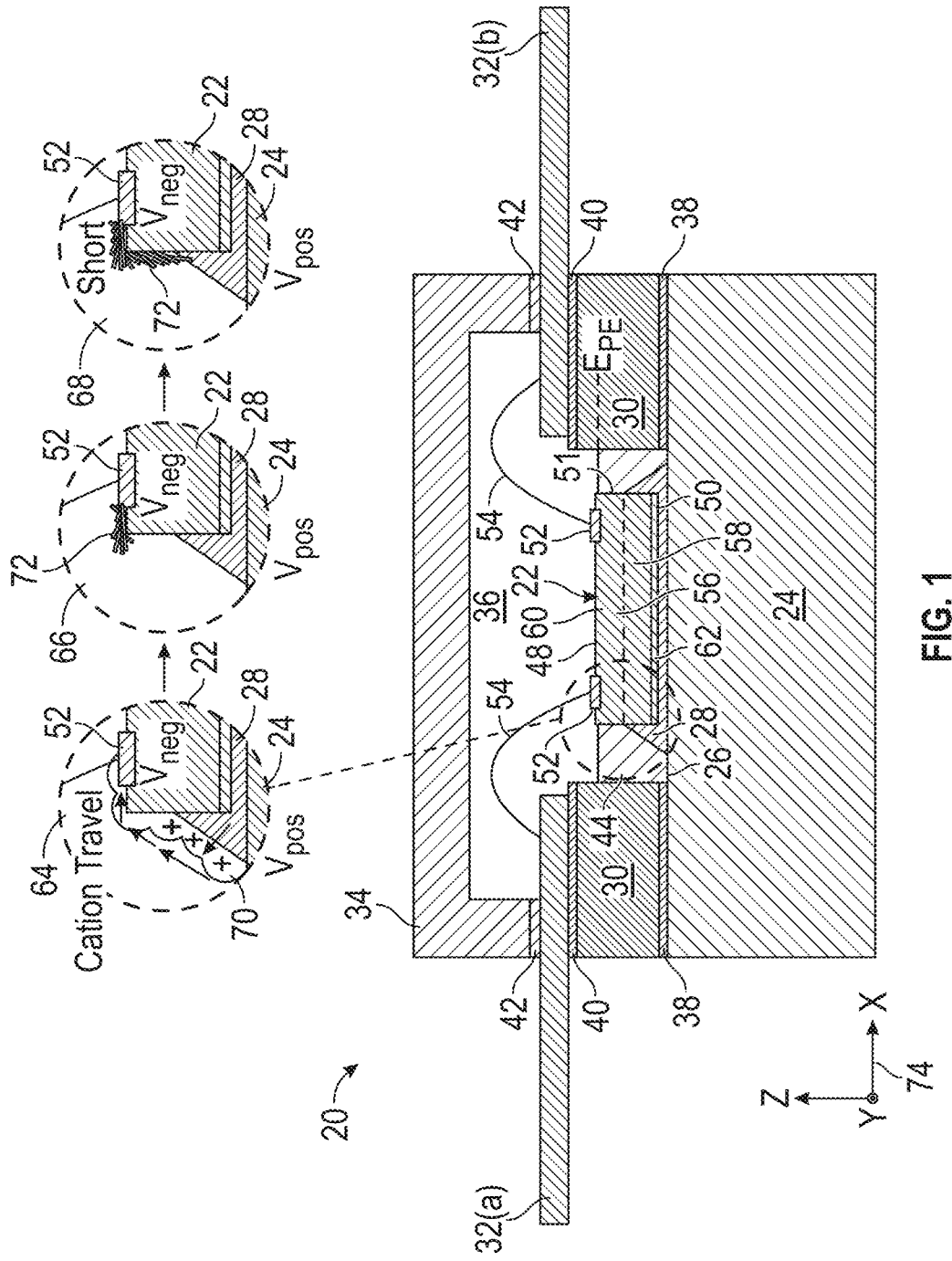
FIG. 1 is a cross-sectional view of a PA package containing two peripherally-encapsulated RF power dies (both visible in FIG. 2), as illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

Definitions

The following definitions apply throughout this document. Those terms not expressly defined here or elsewhere in this document are assigned their ordinary meaning in the relevant technical field.

Backside (of a semiconductor die)—the side (outer principal surface) of a die opposite the frontside of the die (defined below), as taken along an axis orthogonal to the frontside of the die.

Frontside (of a semiconductor die)—the side (outer principal surface) of a die on which the bond pads are exclusively or predominately located.

Metallic—a material predominately composed of one or more metal constituents by weight percentage.

Power amplification (PA) package—a microelectronic package containing at least one radio frequency (RF) power die utilized for power or signal amplification purposes.

Radio frequency (RF) power die—a semiconductor die bearing an integrated circuit (IC) containing at least one transistor utilized for RF power or signal amplification purposes.

Overview

As noted above, PA packages are commonly fabricated to possess either an air (gas-containing) cavity package construction or a fully-encapsulated (overmolded) package construction, which lacks an internal air cavity. For higher performance RF applications, air cavity package constructions may be favored due to certain RF performance benefits obtained by avoiding encapsulation of the RF power die frontsides and the associated interconnect features; e.g., bond wires interconnecting the die bond pads with the package terminals. In addition to the usage of air cavity package constructions, appreciable gains in RF performance parameters can be realized in other manners, as well. For example, additional gains in PA package performance can be achieved through the incorporation of either or both of: (i) power dense die structures, such as layered gallium nitride (GaN) die structures or gallium arsenide (GaAs) die structures; and (ii) metallic base flanges or similar package substrates having favorable electrical and thermal (heat dissipation) properties. In instances in which a given PA package contains one or more RF power dies having metallized backsides serving as (e.g., ground) terminals of the dies, PA package performance may further be optimized by forming low electrical resistance interfaces or bond lines along the junctures between the die backsides, the underlying package substrate, and the intervening layers of die bond material. These interfaces (i.e., the interface between a given RF power die backside and the contacting die bond layer, as well as the interface between the die bond layer and the underlying package substrate) are collectively referred to herein as the "die bond interfaces." Similarly, the combination of an RF power die and the die bond layer attaching the RF power die to the package substrate are jointly referred to herein as a "bonded die structure."

As just stated, PA package performance can be optimized through the formation of low electrical resistance bonds along the die bond interfaces. In instances in which the backside of a given die serves a ground terminal, this may help provide a low electrical resistance path for the ground return current during operation of the transistor integrated circuit carried by a given RF power die. The present assignee has developed unique sintered bond layers, and methods for forming such sintered bond layers utilizing relatively low temperature processing steps, which provide low resistance electrical resistance bonds along the die bond interfaces. Additionally, such sintered bond layers further provide relatively robust, metallurgical bonds between the backside of a given an RF power die, if metallized, and the metallic base flange (or other substrate) to which the die is attached. When utilized, such sintered bond layers may be predominately composed of one or more sintered metals, by weight, with such sintered metals potentially including any combination of silver (Ag), copper (Cu), and gold (Au). In many instances, a sintered bond layer may contain non-trace amounts of Ag, if not contain Ag as a predominate constituent by weight. For example, in at least some implementations, a sintered bond layer may be formulated to consist essentially of sintered Ag (that is, contain at least 99% sintered Ag, by weight), while lacking organic materials. In other embodiments, a sintered bond layer may consist essentially of sintered Ag and one or more organic materials, such as epoxy added to enhance the pliability of the die bond layer. When utilized to attach an RF power die to an underlying package substrate, such sintered die bond layers may be formed by processing sinter precursor materials containing metal particles and other constituents. Elevated temperatures and/or pressures may then be applied to transform the sinter precursor material into a sintered bond layer attaching a given RF power die to a metallic base flange or other package substrate. Examples of processes for attaching RF power dies to a package substrate via the formation of sinter bond layers are further discussed below.

Considerable gains in PA package performance have been achieved via tailoring of the PA package characteristics described above and through the incorporation of sinter bond layers into PA package designs, particularly in the case of air cavity PA packages operated at higher radio frequencies; e.g., radio frequencies approaching or exceeding 3 Gigahertz. Existing high performance air cavity PA package constructions are not without limitations, however. As one such limitation encountered in the context of air cavity PA packages, separation or delamination can gradually occur along die bond interfaces as a given PA package is subject to repeated thermal cycling. Die bond delamination tends to be problematic when a sizable disparity exists between the respective CTEs of a package substrate (e.g., a metallic base flange principally composed of a metal, such as Cu, having a higher CTE) and the RF power die or dies attached thereto. Additionally, the propensity for die bond delamination increases when a given RF power die has a relatively high stiffness. An RF power die may have a relatively high stiffness when fabricated utilizing certain high performance layered die structures, such as layered GaN or GaAs die structures, containing one or more layers composed of relatively stiff base material; e.g., silicon carbide (SiC). So too may an RF power die possess a relatively high stiffness when the body of the RF power die is relatively thick even when composed of bulk silicon (Si) or another material having a lower elastic modulus; here noting that Si, SiC, and similar materials may have a relatively wide range of stiffnesses depending upon crystallography. When possessing a relatively high stiffness, a given RF power die within an air cavity PA package may be incapable of flexing to accommodate thermal growth and geometric distortion of the package substrate, with the die bond interfaces experiencing repeated mechanical stressors as a result Over time, such stressors may induce delamination along the die bond interfaces, potentially resulting in structural compromise of the PA package.

A second issue, encountered in the context of certain PA packages, relates to dendrite growth. This issue occurs predominately, if not exclusively in PA packages including die bond layers containing non-trace amounts of at least one metallic constituent (e.g., Ag) susceptible to certain electrochemical reactions driving dendrite growth; referred to herein as "dendrite growth reactions." Such dendrite growth reactions may occur during operation of an air cavity PA package as moisture accumulates within the air cavity to form a moisture film, which contacts the die bond layer and one or more bond pads exposed along the frontside of an RF power die. As the RF power die is energized, certain metallic constituents within the die bond layer may react within the moisture film to yield a charged ion species, which are injected into the moisture film. Such ions are then able to travel within the moisture film, deposit on the die bond pads bearing an opposing charge, and aggregate as finger-like dendrites. Consider, for example, an embodiment of an air cavity PA package containing a die bond layer, which is predominately composed of Ag and which is contacted by a moisture film. During package operation, a voltage differential is applied across the terminals of the RF power die with a first (e.g., positive) voltage applied to the die backside through the die bond layer and an opposing (e.g., negative) charge imparted to bond pads on the frontside of the RF power die. These conditions support the above-described dendrite growth reactions, which introduce Ag cations ($Ag^+$) into the moisture film contacting the Ag-containing die bond layer. Free to travel within the moisture film, the Ag cations migrate toward the negatively-charged bond pads (acting as cathodes) and ultimately deposit on an outer periphery of the bond pads. As this process repeats, electrically-conductive Ag dendrites grow outwardly from the die bond pads and toward the positively-charged die bond layer. Should the Ag dendrites grow sufficiently large to form an electrically-conductive structure extending from the negatively-charged bond pads to the positively-charged die bond layer (anode), electrical bridging can occur across the terminals of the RF power die. This, in turn, may negatively impact, if not destroy the functionality of the PA package.

The following discloses methods for fabricating PA packages overcoming the above-described issues encountered in the context of high performance air cavity PA packages, while retaining favorable RF performance characteristics on par with such air cavity PA packages. This is accomplished, at least in part, through the incorporation of peripheral encapsulant bodies into PA packages, with the peripheral encapsulant bodies surrounding the RF power dies contained therein. The peripheral encapsulant body is also advantageously dimensioned to avoid (or at least minimize) encroachment of the encapsulant onto the frontside of the packaged RF power dies, while partially defining a lower portion or the floor of a sealed, gas-containing cavity within the PA package. When properly formulated, such peripheral encapsulant bodies reduce the likelihood of RF die delamination across repeated thermal cycling, including in instances when a given RF power die possesses a relatively high stiffness and when there exists a relatively large disparity between the respective CTEs of the packaged RF power die(s) and the underlying package substrate. Concurrently, the peripheral encapsulant body provides a physical barrier impeding, if not preventing physical contact between the die bond layer or layers contained in a given PA package and any moisture accumulation in the gas-containing cavity of the PA package. Consequently, instances in which a given die bond layer contains a metallic constituent prone to the above-described dendrite growth reactions, such as a die bond layer composed of a sintered Ag material, the die bond material is shielded from contact with the moisture film to impede or prevent dendrite growth reactions. RF performance of the resulting PA package is thus optimized, while concerns regarding RF power die delamination and dendrite growth failure modes are alleviated.

The peripheral encapsulant body or bodies contained within a given PA package can be produced utilizing different fabrication processes and may be composed of a wide range of materials. In certain embodiments, a given peripheral encapsulant body may be composed of a suitable material, such as a thermosetting (e.g., organic) polymer, which is deposited around an RF power die during package manufacture utilizing a molding process, such as pour, transfer, or injection molding. In certain instances, the encapsulant material may be deposited in sufficient volume such that, once cooled, the encapsulant material creates the peripheral encapsulant body (or bodies) having a desired final thickness or height, as measured along a vertical axis extending orthogonal to the die-support surface of the package substrate. In other instances, the encapsulant material may be deposited to have an excessive thickness or overburden, which is subsequently removed, such as by dry (e.g., plasma microwave) etching or wet (chemical) etching, to impart the peripheral encapsulant body with its desired final dimensions. In either case, the uppermost edge or surface of the peripheral encapsulant body may be located closer to the frontside of the die than to the die-support surface of the package substrate, as taken along a vertical axis or the package centerline; e.g., in embodiments, the uppermost edge of the peripheral encapsulant body may be substantially flush with (that is, substantially coplanar with) or located slightly below the frontside of the peripherally-encapsulated RF power die or dies contained within a given PA package. Other techniques for creating the peripheral encapsulant bodies can also be employed in alternative embodiments. For example, in other implementations, a preform composed of a suitable material (e.g., a thermosetting polymer, a solder, or another material capable of reflow) may be fitted around the periphery of one or more dies and then bonded in place (e.g., by heating or reflowing the preform) to form a moisture-barrier about the die periphery, perhaps covering the die bond layer attaching the die to the package substrate. In still other instances, other materials (e.g., a glob top material) can be discretely deposited around the periphery of the bonded die structure utilizing a suitable dispense technique (e.g., a computer-controlled fine needle dispense process) to create a generally conformal, annular body surrounding the bonded die structure and serving as the peripheral encapsulant body.

Additional description of methods for fabricating PA packages containing peripherally-encapsulated RF power dies is set-forth below in connection with FIGS. 3-12. First, however, an example embodiment of a PA package containing two peripherally-encapsulated RF power dies is described in conjunction with FIGS. 1 and 2. Finally, testing results demonstrating the effectiveness of the below-described package constructions in eliminating or reducing die bond delamination and dendrite growth failure modes are also discussed below in connection with FIGS. 13-16. The following examples are offered by way of non-limiting illustration only, emphasizing that further embodiments of the below-described PA packages and associated fabrication methods can differ in various respects without departing from the scope of the present disclosure set-forth in the appended Claims.

Example Power Amplifier Packages Containing Peripherally-Encapsulated RF Power Dies and Associated Fabrication Methods FIG. 1 is a generalized cross-sectional view of PA package 20 containing two peripherally-encapsulated RF power dies 22, as depicted accordance with an exemplary embodiment of the present disclosure. While only one of RF power dies 22 is shown in FIG. 1, the RF power die 22 hidden from view in FIG. 1 can be seen in FIGS. 2, 5, and 6, as described below. In embodiments in which PA package 20 has a (e.g., two-way) Doherty PA architecture, one of the depicted RF power dies 22 may be a peaking die containing one or transistors (e.g., FETs) providing amplification of the peaking signal, while the other RF power die 22 is a carrier die containing one or transistors (e.g., FETs) providing amplification of the carrier signal. RF power dies 22 are bonded to and supported by an underlying package substrate 24, which has a frontside or die-support surface 26 and an opposing backside. In the illustrated example, package substrate 24 assume the form of a metallic base flange and will consequently be referred to hereafter as "base flange 24." The instant example notwithstanding, package substrate 24 can assume various other forms in further embodiments, such as that of a ceramic substrate, a coreless substrate, or a multi-layer (e.g., land grid array or ball grid array) substrate, to list but a few examples. Further, while shown as containing two RF power dies 22 in FIG. 1, PA package 20 can contain a greater or lesser number of semiconductor dies in alternative embodiments, along with any number of additional passive or active microelectronic components, including discrete SMD resistors, inductors, or capacitors.

RF power dies 22 are attached to die-support surface 26 of base flange 24 by electrically-conductive die bond layers 28. In embodiments, die bond layers 28 contain at least one metallic constitute prone to dendrite growth reactions if contacted by moisture in the presence of an electrical current, as further discussed below. Die bond layers 28 may be at least partially composed of a sintered metal, such as a sintered Ag material, in at least some implementations of PA package 20. For this reason, die bond layers 28 may be more fully referred to herein as "metal-containing die bond layers 28." It is emphasized, however, that die bond layers 28 need not contain Ag or other metallic constituents in all embodiments of the present disclosure; e.g., in alternative embodiments, die bond layers 28 may lack such metallic constituents in implementations in which the below-described peripheral encapsulant bodies are provided solely (or at least principally) to reduce the likelihood of die bond layer delamination.

The construction and formfactor of PA package 20 will vary between embodiments. In the illustrated example, PA package 20 includes a package sidewall structure 30 positioned over and bonded to die-support surface of base flange 24. Package leads 32 are bonded to and project outwardly from sidewall structure 30; again noting that, in other embodiments, the terminals of PA package 20 may vary and, in certain embodiments, PA package 20 may be a no-lead package having a ball grid array, a land grid array, or other contact array serving as the input output (I/O) interface of the package. A lid or cover piece 34 is bonded over leads 32 and sidewall structure 30 to enclose a gas-containing cavity 36 within PA package 20. RF power dies 22 are exposed to gas-containing cavity 36, which may be filled with air, argon, or another inert gas, and may or may not be partially evacuated. Gas-containing cavity 36 is sealed from the ambient environment; however, the seal formed between cavity 36 and the ambient environment may not be hermetic, as strictly defined, but rather may be a low leakage seal having a gross leakage rate falling within acceptable parameters. Further, despite the sealed nature of cavity 36, moisture may still ingress into and accumulate within gas-containing cavity 36 in at least some instances, such as when PA package 20 is operated in a humid environment and as the internal pressure within cavity 36 fluctuates within variations in local temperatures occurring during package operation.

PA package 20 may be fabricated utilizing a window frame approach in some embodiments. In such embodiments, package sidewall structure 30 may be provided in the form of a rectangular, ring- or frame-shaped structure (a "window frame") having a central opening therethrough and composed of a ceramic, an electrically-insulative polymer, or another a dielectric material. During fabrication of PA package 20, the window frame is positioned over base flange 24 and bonded in place utilizing a first bond layer 38. Afterwards, base flange 24 and the window frame may be positioned relative to package leads 32, which may be initially provided as an interconnected leadframe; and a second bond layer 40 is then formed to attach the upper edge of the window frame (sidewall structure 30) to package leads 32. RF power dies 22 may then be installed within cavity 36 by formation of die bond layers 28; the requisite electrical interconnections are formed by, for example, wire bonding; and cover piece 34 is then secured in place utilizing a third bond layer 42 to enclose gas-containing cavity 36 and complete fabrication of PA package 20. Bond layers 38, 40, 42 can be composed of dielectric epoxies, die attach materials, or other bonding materials. The above-listed process steps are non-exhaustive, noting that, at some juncture following die attach and preceding lid attach, one or more peripheral encapsulant bodies 44 are further formed within PA package 20 to one or both of the packed dies 22. Additional description in this regard is provided below. In other embodiments, PA package 20 may be fabricated in another, such as by obtaining the package leads, the sidewall structure, and the package substrate (e.g., base flange 24) as a prefabricated "header" assembly. Further, in alternative embodiments, sidewall structure 30 may be formed in another manner utilizing, for example, an overmolding process similar to that described below in connection with FIGS. 11 and 12.

Figure 2:
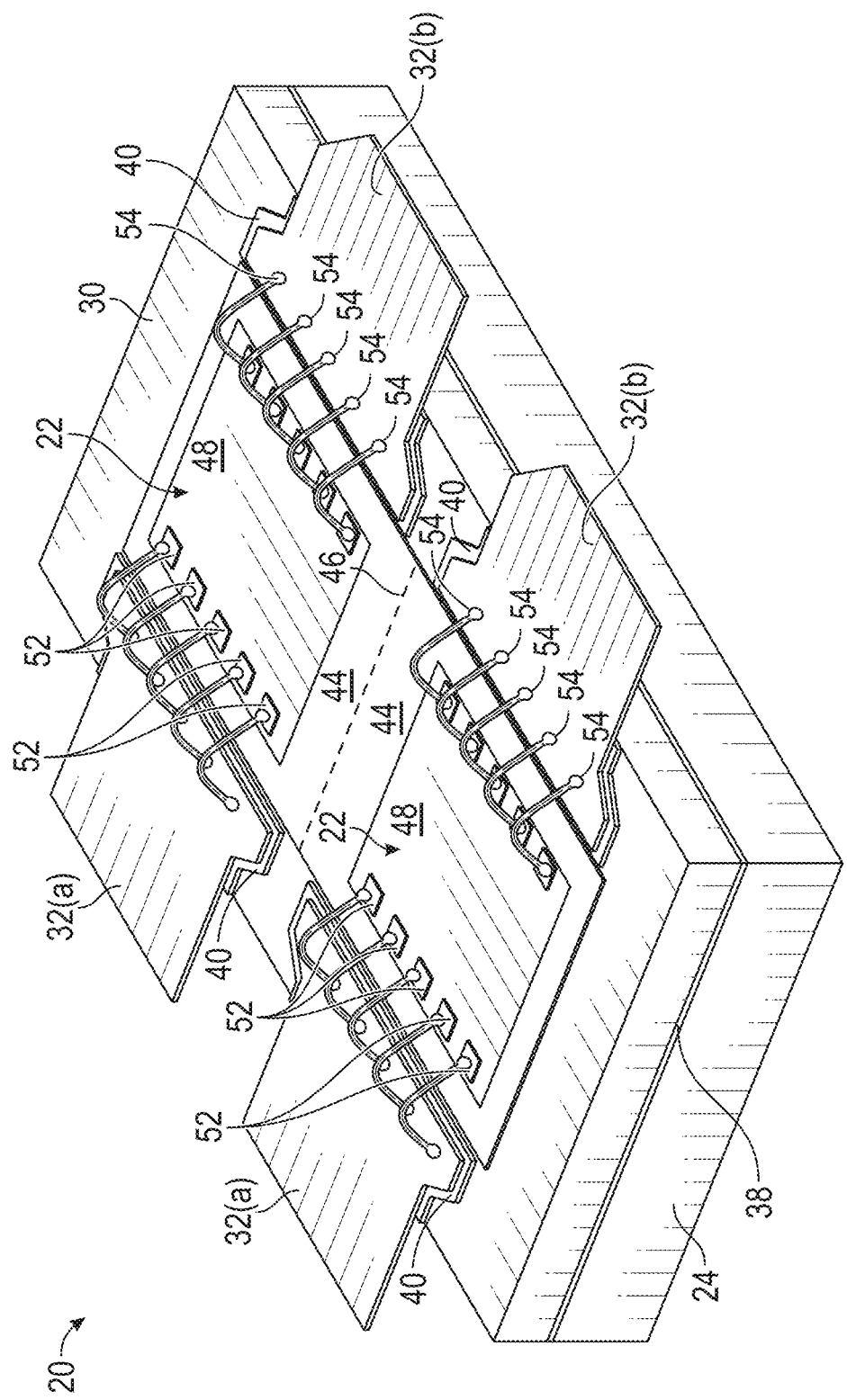
FIG. 2 is an isometric view of the example PA package of FIG. 1, as shown prior to cover piece attachment to reveal the interior package structure including conjoined or integrally-formed peripheral encapsulant bodies surrounding the packaged RF power dies.

FIG. 2 illustrates PA package 20 isometrically prior to attachment of cover piece 34. Referring jointly to FIGS. 1 and 2, RF power dies 22 are each installed within a lower portion of cavity 36 and peripherally surrounded by a peripheral encapsulant body 44. As shown most clearly in FIG. 2, two peripheral encapsulant bodies 44 may be provided, each extending around one of the packaged dies 22. In this particular example, peripheral encapsulant bodies 44 are integrally formed as a single mass or conjoined body; hence, the boundary between encapsulant bodies 44 is somewhat conceptual, but is generally demarcated by dashed line 46 in FIG. 2. In further implementations, peripheral encapsulant bodies 44 may not be integrally formed or merged in this manner, but rather separated by an air gap (void) or a physical structure internal to PA package 20; e.g., in certain cases, a fin-like structure serving as an electromagnetic interference (EMI) shield may extend between package dies 22 and partition encapsulant bodies 44. The integration of peripheral encapsulant bodies 44 into PA package 20 can provide one or more benefits, depending upon other package characteristics. Such benefits may include a greatly decreased likelihood of bond layer delamination relative to comparable air cavity packaging lacking peripheral encapsulant bodies 44. Additionally or alternatively, such benefits may include the inhibition, if not the wholesale prevention of dendrite formation in instances in which metal-containing die bond layers 28 (and/or die support surface 26) is at least partially composed of one or more metallic constituents, such as Ag, prone to the dendrite growth reactions. Additional description of the manner in which peripheral encapsulant bodies 44 provide these benefits is set-forth below. First, however, PA package 20 and RF power dies 22 are described in greater detail to provide an example, albeit non-limiting context in which the benefits of peripheral encapsulant bodies 44 may be better understood.

With continued reference to FIGS. 1 and 2, RF power dies 22 each include an upper principal surface or "frontside" 48, an opposing lower principal surface or "backside" 50 (FIG. 1), and outer peripheral sidewalls 51. The respective backsides 50 of RF power dies 22 are attached to the upper principal surface or die support surface 26 of base flange 24 via die bond layers 28, which may be composed of a metal-containing material, as previously mentioned. Circuitry is formed beneath frontsides 48 of RF power dies 22, while a number of bond pads 52 are provided on frontsides 48 to at least partially form the I/O interface of each RF power die 22. Bond pads 52 are electrically coupled to internally-exposed edges of package leads 32 by wire bonds 54. At least a majority, if not the substantial entirety of the respective frontsides 48 of RF power dies 22 are each exposed from within gas-containing cavity 36, as are bond wires 54, to optimize the RF performance parameters of PA package 20. As a corollary, gas-containing cavity 36 is partially defined, bordered, or bound by die frontsides 48 and the upper surfaces of peripheral encapsulant bodies 44; e.g., die frontsides 48 and peripheral encapsulant bodies 44 bound a lower portion or "floor" of gas-containing cavity 36, as discussed below.

In alternative implementations, PA package 20 may contain a different terminal type (e.g., package 20 may be a no-lead package) and/or another wiring approach may be employed to electrically interconnect bond pads 52 of RF power dies 22 with the appropriate package terminals. In one embodiment, a first set of leads 32(a) projects from a first side of PA package 20 and serves as inputs electrically coupled to input terminals (e.g., gate terminals) of RF power dies 22, which may each contain one or more transistor (in this example, one or more FETs). A second set of leads 32(b) projects from a second, opposing side of package 20 and serves as outputs electrically coupled to output terminals (e.g., drain terminals) of RF power dies 22. Base flange 24 may itself serve as a ground terminal of PA package 20 (e.g., electrically coupled to source terminals of RF power dies 22), providing that die bond layers 28 are composed of an electrically-conductive material. Again, while shown as containing two RF power dies 22 electrically coupled in parallel in the illustrated example, PA package 20 can contain any number and type of microelectronic devices in further embodiments, as well as other electrically-active components disposed in various different interconnection schemes. For example, in a further implementation, PA package 20 may contain two or more RF power dies 22 electrically coupled in series between package leads 32(a)-(b). Finally, while principally described as containing FETs herein, RF power dies 22 can be implemented utilizing bipolar transistors or any other suitable transistor type in alternative embodiments.

RF power dies 22 can be fabricated utilizing various die technologies. In embodiments, RF power dies 22 may be fabricated utilizing a bulk piece of silicon (Si) or another semiconductor material. In other embodiments, RF power dies 22 may be produced using a layered die structure, such as a GaN or GaAs die structure. This is generically illustrated in FIG. 1 for RF power die 22, which is illustrated as including a die body 56, 58 over which a number of frontside layers 60 are produced. Again, die body 56, 58 can be composed of a single semiconductor material when, for example, RF power die 22 is produced utilizing a singulated piece of a bulk Si wafer. Alternatively, die body 56, 58 can be composed of multiple layers of disparate materials including at least one layer or body of a semiconductor material. In this latter regard, in implementations in which RF power die 22 is produced utilizing a layered (e.g., GaN) die technology, an upper portion 56 of die body 56, 58 may be essentially or predominantly composed of a first semiconductor material (e.g., GaN) by weight, while a lower portion 58 of die body 56, 58 is composed of another material (or combination of materials), such as SiC, on which the first semiconductor (e.g., GaN) layer is formed. Frontside layers 60 also include additional patterned metal layers defining bond pads 52 and interconnect lines, dielectric layers for providing isolation between the discrete features of the patterned metal layers, and perhaps an outer passivation layer at least partially defining frontside 48 of RF power die 22. Opposite frontside 48, a backmetal layer or multi-layer system 62 may be provided to promote metallurgical bonding and low resistance electrical contact with die bond layers 28. In other embodiments, RF power die 22 (and, by extension, RF power die 22) may lack such a backmetal layer or multi-layer system. When fabricated utilizing a high power density layered die structure, such as a GaN or GaAs die structure, and/or when dimensioned to be relatively thick, RF power dies 22 may each have a relatively high stiffness; e.g., in such embodiments, RF power dies 22 may each have a Young's modulus exceeding 100 and, perhaps, exceeding 300 gigapascals (Gpa).

Base flange 24 can be any body of material, layered structure, or composite structure serving as a substrate upon which the remainder of PA package 20 is produced. In certain embodiments, and as previously noted, base flange 24 may serve as an electrically-conductive terminal of PA package 20 and, perhaps, as a heat sink or heat spreader. In one implementation, base flange 24 assumes the form of a monolithic metallic structure, plate, or slug. In other implementations, base flange 24 may assume the form of a printed circuit or wiring board. As a further possibility, base flange 24 may be produced from an organic material (e.g., a resin similar or identical to that from which printed circuit boards are produced) containing a metal (e.g., Cu) coin. In still further embodiments, base flange 24 may have a multilayer metallic construction. In such embodiments, base flange 24 may contain multiple thermally-conductive layers, which are bonded in a stacked or laminated arrangement. In either case, base flange 24 will typically be composed predominately of one or more metals having relatively high thermal conductivies, such as Cu. For example, in an embodiment wherein base flange 24 is a layered or laminated structure, base flange 24 may include at least one Cu layer combined with at least one disparate metal layer having a CTE less than that of the Cu layer. The disparate metal layer may be composed of, for example, molybdenum (Mo), a molybdenum-copper (Mo—Cu) alloy, or a Mo—Cu composite material. In this manner, base flange 24 may be imparted with both a relatively high thermal conductivity and a lower effective CTE, which is more closely matched to that of RF power dies 22 and/or to that of package sidewall structure 30. Thermally-induced stress within PA package 20 can be reduced as a result.

As noted above, metal-containing die bond layers 28 are advantageously fabricated as sintered bond layers in embodiments. In this case, die bond layers 28 may each be produced from a metal particle-containing precursor material, which is densified into a substantially coherent mass or layer during a low temperature sintering process. In such embodiments, die bond layers 28 may be predominately composed of at least one metal (e.g., Cu, Ag, Au, or a mixture thereof) by weight. In one specific embodiment, metal-containing die bond layers 28 contain sintered Ag and, perhaps, may be predominately composed of sintered Ag by weight; that is, die bond layers 28 may each be composed of at least 50% Ag, by weight In certain instances, metal-containing die bond layers 28 may consist essentially of sintered Ag and may lack organic materials; while, in other embodiments, die bond layers 28 may consist essentially of sintered Ag and one or more organic fillers, such as an epoxy. Regardless of whether die bond layers 28 are formed from sintered materials, it will often be the case that metal-containing die bond layers 28 are at least partially composed of Ag and/or another metallic constituent prone to the dendrite growth-related dendrite growth reactions described herein; e.g., in various embodiments, die bond layers 28 may each contain at least 10% Ag by weight and, perhaps, may each be predominately composed of Ag by weight. It is not required that metal-containing die bond layers 28 contain such a metallic constituents in all embodiments; however, noting that peripheral encapsulant bodies 44 may be beneficially integrated into PA package 20 for reasons other than dendrite growth suppression in embodiments, such as to decrease the likelihood of die bond layer delamination, as described throughout this document. Moreover, in at least some instances, the upper surface or skin region of base flange 24 can contain Ag or another metallic constituent prone to dendrite growth-related dendrite growth reactions, which may further be deterred by the provision of peripheral encapsulant bodies 44 in embodiments.

As best shown in FIG. 2, peripheral encapsulant bodies 44 extend around the respective outer peripheries of RF power dies 22. Peripheral encapsulant bodies 44 may further contact and be bonded to the outer sidewalls of RF power dies 22; such that, in combination with metal-containing die bond layers 28, more than half of the cumulative surface area of die sidewalls 51 is covered and, thus, less than half of the cumulative surface area of die sidewalls 51 is exposed within gas-containing cavity 36. Relatedly, in embodiments, each peripheral encapsulant body 44 may contact the outer peripheral sidewalls 51 of its corresponding RF power die along at least a majority of the cumulative surface area of sidewalls 51 left exposed by die bond layers 28. More generally, each peripheral encapsulant body 44, taken in combination with the corresponding die bond layer 28, may cover and be bonded to at least half the cumulative surface area of die sidewalls 51 in embodiments; here noting that each die bond layer 28 may not contact the sidewalls 51 of its corresponding die 22 in certain instances, such as when die bond layer 28 is formed to have a lower volume or when bond layer 28 formed from a sinter precursor material applied as a thin film, which does not tend to encroach onto sidewalls 51 during curing. In still other embodiments, a given peripheral encapsulant body 44 (whether considered alone or in combination with the corresponding die bond layer 28) may contact less than half the cumulative surface area of die sidewalls 51, while still providing the benefits described herein.

Peripheral encapsulant bodies further contact die bond layers 28, die-support surface 26 of base flange 24, and the interior periphery of package sidewall structure 30 in the illustrated example. Further, peripheral encapsulant bodies 44 are deposited to substantially fill the free space or void area within the interior of PA package 20 below a particular elevation or height, as measured above die-support surface 26 of base flange 24. This elevation is identified in FIG. 1 as "$E_{PE}$" ("PE" indicating "peripheral encapsulant") and may be located at the same elevation as is die frontside 48 or slightly below die frontsides 48. Stated differently, the uppermost edges of peripheral encapsulant bodies 44 (that is, the edge located furthest base flange 24) may be substantially coplanar with or located slightly between die frontsides 48 in embodiments. More generally, the uppermost edge of each peripheral encapsulant body 44 will typically be located closer to the frontside of the die 22 surrounded by peripheral encapsulant body 44 than to die support surface 26 of base flange 24, as taken along an axis orthogonal to surface 26 (parallel to the Z-axis of coordinate legend 74). As a corollary, wire bonds 54 may extend over encapsulant bodies 44, while having a non-contacting relationship therewith to help optimize RF performance of PA package 20, as described below.

In embodiments, peripheral encapsulant bodies 44 may fully cover metal-containing die bond layers 28, as viewed looking downwardly on the bonded dies structures from within cavity 36. Additionally, peripheral encapsulant bodies 44 fully cover the exposed region of die support surface 26 of base flange 24 between the inner edges of sidewall structure 30 and the outer peripheral edge or fillet of metal-containing die bond layers 28. In other embodiments, peripheral encapsulant bodies 44 may cover at least a majority of metal-containing die bond layers 28, by surface area; and/or peripheral encapsulant bodies 44 may or may not fully cover any exposed area of die support surface 26 of base flange 24 within the package interior. In various embodiments, peripheral encapsulant bodies 44 may cover or encapsulant the outer interfaces or junctures formed (i) between metal-containing die bond layers 28 and the sidewalls of RF power dies 22, and/or (ii) between die bond layers 28 and base flange 24. Thus, each peripheral encapsulant bodies 44 may also be described as extending end over a juncture formed between a metal-containing die body layer 28 and the die sidewalls 51 (or extending over the upper terminal edge of die bond layer 28) toward die frontside 48 of one of RF power dies 22, while terminating prior to encroaching onto the die frontside. Peripheral encapsulant bodies 44 may be composed of any material suitable for providing the functions herein. In various embodiments, peripheral encapsulant bodies 44 are composed of an organic polymer material, such as a mold compound or underfill material.

The provision of peripheral encapsulant bodies 44 within PA package 20 may provide at least one of two benefits: (i) inhibiting of dendrite growth reactions in the event of moisture ingress into gas-containing cavity 36, and (ii) a decreased likelihood of die bond delimination at the bond interfaces between RF power dies 22, die bond layers 28, and base flange 24. As discussed above, many PA packages, or microelectronic packages generally, are not susceptible to dendrite growth and/or are associated with a relatively low likelihood of die bond delamination. For example, such issues may not arise in the context of fully encapsulated (overmolded) PA packages lacking an air cavity; however, as also previously discussed, such fully encapsulated packages are associated with other drawbacks, such as decreased RF performance. Die bond delamination is also typically less problematic, if not non-problematic in implementations in which there exists minor disparities in the CTE between the packaged die or dies and the base flange (hereafter, the "die-to-flange CTE differential"); and/or when the packaged die or dies are sufficiently flexible to accommodate movement and distortion of the base flange relative to the packaged die(s). Such die bond delamination issues thus tend to arise when there exists a relatively large die-to-flange CTE differential and the packaged die(s) have a relatively high stiffness. Referring to PA package 20, RF power dies 22 may have a relatively high stiffness when fabricated from a GaN die structure (or a GaAs die structure) containing a support layer composed of SiC or another highly stiff material (depending upon crystallography). In other embodiments, the packaged die or dies may have a high stiffness if entirely composed of SiC; or, if composed of a more flexible material, such as bulk Si, while having a relatively high thickness.

Addressing dendrite growth, again issues with dendrite growth are not applicable to a majority of microelectronic packages. Instead, such dendrite growth issue tend to arise when (i) a PA package contains an air cavity, (ii) the air cavity is contaminated by moisture, (iii) the moisture forms a film across which a voltage differential is applied, (iv) the moisture contacts an electrically-active material containing at least one metallic constituent (e.g., Ag) prone to an dendrite growth reaction injected ions into the water film, and (v) the voltage differential is such that the ions are urged to travel from the material to at least one bond pad, accumulate, and form dendrites, with the dendrites potentially creating an electrically-conductive bridge extending from the bond pad(s) to the electrically-active material. The electrically-active material is imparted with a charge opposite the bond pad(s) and can be, for example, the die bond layer. This mechanism driving dendrite growth may be appreciated by considering upper detail bubbles 64, 66, 68 in FIG. 1, which illustrate a magnified region of PA package 20 absent the provision of peripheral encapsulant bodies 44. In this example, a negative voltage (e.g., between 1 and 10 volts) is applied to the illustrated bond pad 52, while a positive voltage is applied to (e.g., between 1 and 10 volts) is applied to metal-containing (e.g., sintered) die bond layers 28 to provide the desired electrical (e.g., ground or other reference voltage) coupling to the backside of the illustrated RF power die 22. As indicated in left detail bubble 64, moisture may collect within the sealed environment of PA package 20 and condense to form a moisture film contacting the illustrated bond pad 52 and die bond layers 28. Die bond layers 28 may be composed of a material containing at least one metal (e.g., Ag) prone to a dendrite growth reaction injecting ions (here, Ag cations represented by plus signs in detail bubble 64) into moisture film 70. Attracted to the negatively-charged bond pad 52 (here, acting as a cathode), the Ag cations travel in moisture film 70 to the bond pad 52 and deposit thereon. As this process repeats, a dendrite structure 72 forms, as indicated in middle detail bubble 66. Should this dendrite structure become sufficiently large to contact or nearly contact the upper peripheral edge of die bond layers 28, an electrical bridge is formed between electrodes of opposing charges and the operation of RF power die 22 may be degraded, if not wholly compromised.

The provision of peripheral encapsulant bodies 44 mitigates both of the above-described issues. Addressing first die bond delamination, such delamination tends to occur due to local stresses concentrated at the die bond interfaces across thermal cycling; e.g., in the case of PA package 20 at the interfaces between RF power dies 22 and their respective die bond layers 28, and at the interface between die bond layers 28 and base flange 24. When formulated to adequately bond to the contacted surfaces and to possess certain key properties, peripheral encapsulant bodies 44 can significantly decrease the likelihood of die bond delamination over the operational lifespan of PA package 20. To provide this anti-delamination function, it has been determined that peripheral encapsulant bodies 44 are beneficially composed of a material having a relatively high modulus of elasticity, such as a Young's modulus exceeding 1 Gpa and, perhaps, exceeding 5 Gpa in embodiments. Concurrently, in embodiments in which base flange 24 has a first CTE, peripheral encapsulant bodies 44 may be composed of a material having a second CTE that is somewhat similar to the first CTE; e.g., in embodiments, the peripheral encapsulant bodies 44 may be composed of a material having a second CTE equal to the first CTE+10 parts per million per degree Celsius (ppm/° C.). Further, in at least some instances, peripheral encapsulant bodies 44 may be composed of an encapsulant material (e.g., a mold, underfill, or a globtop material) having a Young's modulus ranging from about 5 to about 30 Gpa and/or a CTE ranging from about 7 to about 25 ppm/° C. In other embodiments, peripheral encapsulant bodies 44 may be composed of a material having a Young's modulus or CTE outside of the aforementioned ranges. Without being bound by theory, the provision of peripheral encapsulant bodies 44 is believed to reduce local stresses at the die bond interfaces and to help prevent initial crack formation or "lift off" at the outer peripheral edges of the die bond interfaces, which are often susceptible to die bond delamination. This may particularly beneficial when the CTE differential is between RF power dies 22 and base flange 24 is relatively large as may be the case when, for example, RF power dies 22 are fabricated utilizing GaN (or similar) die structures including at least one layer composed of a material (e.g., SiC) having a relatively low CTE, while base flange 24 is predominately composed of a metal (e.g., Cu) having a relatively high CTE. The provision of peripheral encapsulant bodies 44 consequently reduces the susceptibility of PA package 20 to die bond delamination to improve long term package reliability.

Concurrently, peripheral encapsulant bodies 44 serve as a physical shield or barrier layer impeding contact between metal-containing die bond layers 28 and any moisture that may accumulate within gas-containing cavity 36 over time. Thus, even when die bond layers 28 are composed of a sintered Ag material or another material containing a metallic constituent prone to ionic dissolution in moisture, the potential for dendrite growth within PA package 20 is minimized, if not eliminated. Similarly, in embodiments in which die support surface 26 is composed of Ag or another material prone to such dendrite growth reactions (e.g., as may be the case when metallic base flange 24 has a plated Ag finish along its upper die support surface), peripheral encapsulant bodies 44 may likewise inhibit moisture contact with surface of flange 26 to further reduce or eliminate concerns regarding dendrite growth. Additionally, tarnish of such an Ag (or similar plating) may be minimized. As a further benefit, peripheral encapsulant bodies 44 are dimensioned to avoid encroachment (or to minimize encroachment) of encapsulant bodies 44 onto the respective frontsides 48 of RF power dies 22 and to avoid encapsulation of wire bonds 54 (which may serve as inductors) to optimize the RF performance characteristic of PA package 20. Finally, as a still further benefit, PA package 20 is amenable to fabrication with relatively little variation and cost addition to existing manufacturing process flows, noting that peripheral encapsulant bodies 44 can often be formed utilizing a small number of process steps, if nota single process step. An example method for fabricating PA package 20 will now be described in connection with FIGS. 3-7.

Figure 3:
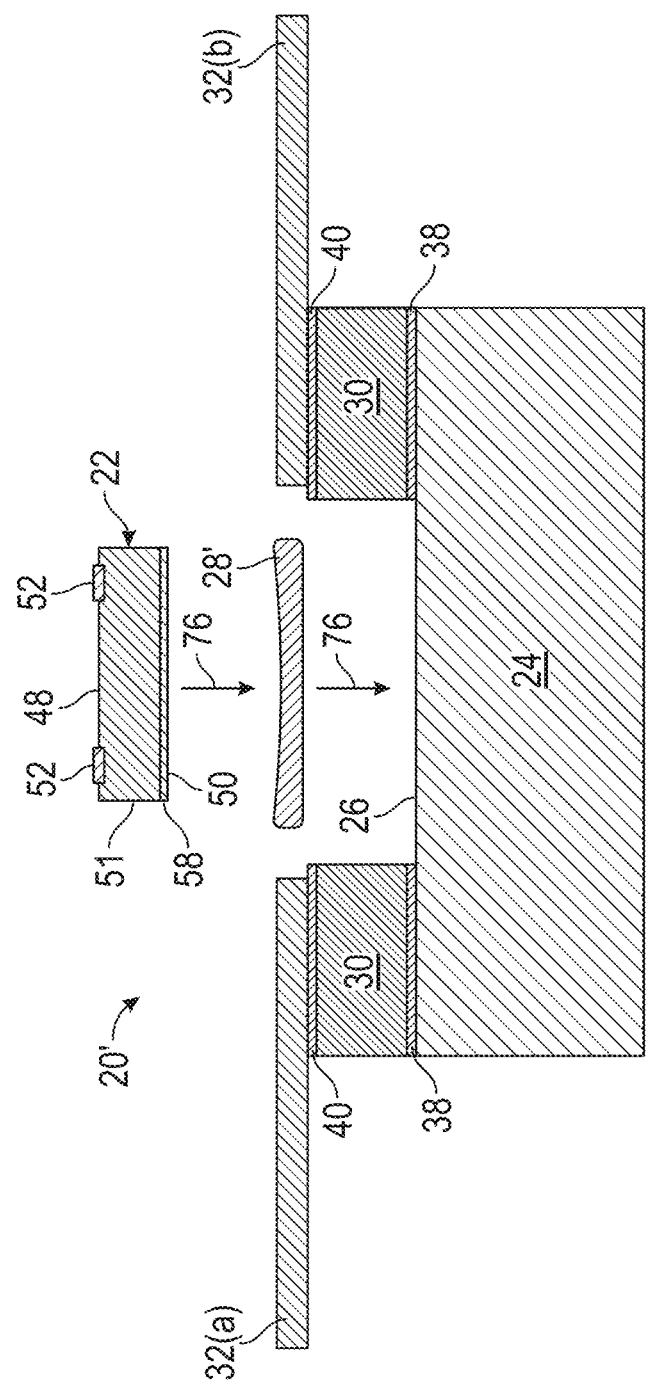
FIGS. 3-6 illustrate, in a step-by-step sequence, manufacturing steps suitably carried-out to fabricate the example PA package shown in FIGS. 1 and 2 in embodiments which the peripheral encapsulant bodies are formed utilizing a molding or potting process.

Referring initially to FIG. 3, PA package 20 is shown in an intermediate stage of manufacture and is thus identified by reference numeral "20'," the prime symbol (') appended to reference numerals when denoting structural elements in an incomplete or partially-fabricated state. At this juncture of manufacture, a die-substrate assembly 24, 30, 32, 38, 40 has been purchased, independently fabricated and includes base flange 24, peripheral sidewall structure 30, package leads 32, and bond layers 38, 40. As indicated by arrows 76, a bond layer precursor material 28' is applied onto the targeted die bond region or area of base flange 24, whether prior to or concurrent with die placement Stated more fully, the bond layer precursor material 28' can be applied onto base flange 24 (either in a wet or dry state) prior to positioning of RF power die 22; or, instead, applied to backside 50 of RF power die 22, which is then positioned against base flange 24. Die bond precursor material 28' usefully assumes the form of a sinter precursor material and is thus referred to hereafter as the "sinter precursor material 28'." The present example notwithstanding, other types of bond materials (and precursor materials from which such bond materials are formed) can be utilized to attach the RF power dies 22 to base flange 24 including, but not limited, solders and electrically-conductive die attach materials, such as metal-filled (e.g., Ag-filled) epoxies.

As noted above, sinter precursor material 28' can be applied utilizing either a wet state or dry state application technique. Wet state application techniques suitable for application of sinter precursor material 28' include, but are not limited to, screen or stencil printing, doctor blading, spraying, and fine needle dispense techniques. In addition to metal particles of the type described below, wet state sinter precursor material 28' may contain other ingredients (e.g., a solvent and/or surfactant) to facilitate wet set application, to adjust the viscosity of the precursor material, to prevent premature agglomeration of the metal particles, or to serve other purposes. In one embodiment, wet state sinter precursor material 28' contains metal particles in combination with a binder (e.g., an epoxy), a dispersant, and a thinner or liquid carrier. The volume of solvent or liquid carrier contained within sinter precursor material 28' can be adjusted to tailor the viscosity of sinter precursor material 28' to the selected wet state application technique. For example, in an implementation in which precursor material 28' is desirably applied by screen printing or doctor blading, sinter precursor material 28' may contain sufficient liquid to create a paste, slurry, or paint. After application of the wet state sinter precursor material 28', a drying process can be carried-out to remove excess liquid from the bond layer precursor material, if so desired. In further embodiments, sinter precursor material 28' can be applied utilizing a dry state application technique. In this case, sinter precursor material 28' can be applied utilizing a film transfer process or other dry state application technique can be utilized to apply the precursor material onto base flange 24.

Regardless of whether sinter precursor material 28' (FIG. 9) is applied in a wet or dry state, the metal particles dispersed within sinter precursor material 28' can have any composition, shape, and size enabling the particles to form a substantially coherent adhesive layer pursuant to the below-described sintering process. In one embodiment, sinter precursor material 28' contains Au, Ag, or Cu particles, or a mixture thereof. In another embodiment, the metal particles contained within sinter precursor material 28' consist essentially of Ag or Cu particles. The metal particles contained within precursor material 28' may or may not be coated with an organic material. For example, in some implementations, the metal particles may be coated with an organic dispersant, which prevents or minimizes physical contact between the particles to inhibit premature agglomeration and particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized in the fabrication process. The metal particles contained within sinter precursor material 28' (FIG. 3) can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 μm and about 10 nanometers (nm) in an embodiment. In other embodiments, the metal particles may have average maximum dimensions greater than or less than the aforementioned range. As a specific, albeit non-limiting example, the sinter precursor material 28' may contain at least one of Ag, Au, or Cu nanoparticles or micron-sized particles in an embodiment, with Ag or Cu nanoparticles preferred.

Figure 4:
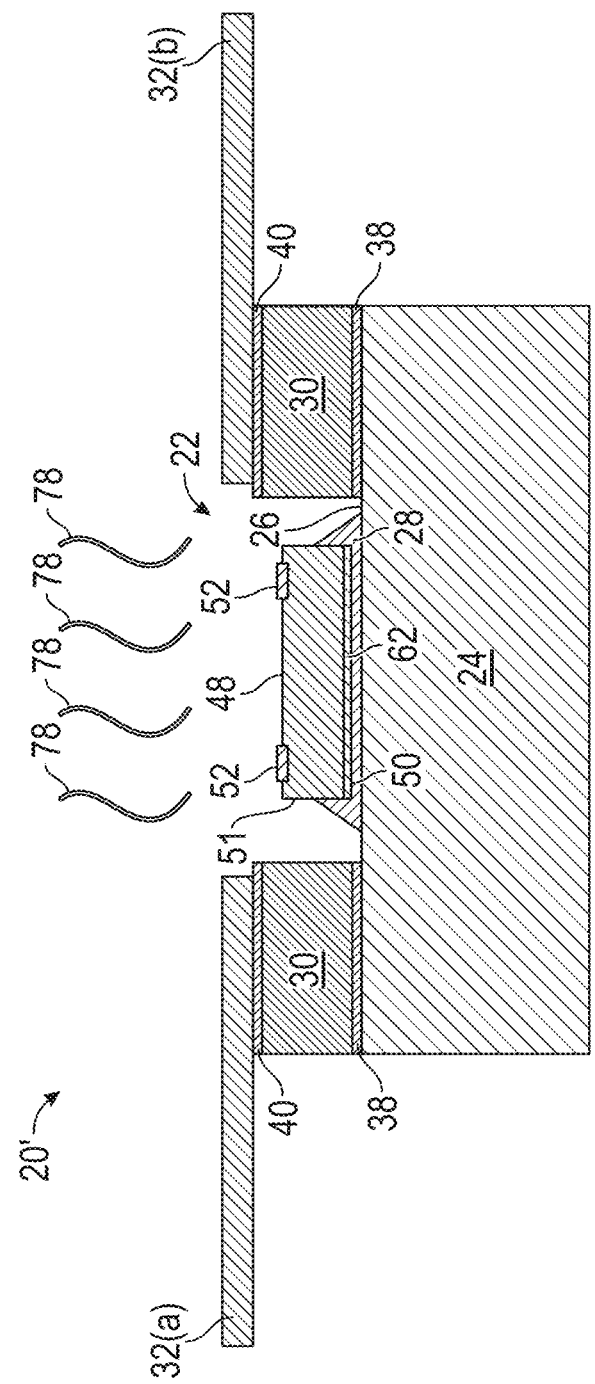

After application of sinter precursor material 28', and seating of RF power dies 22 onto base flange 24 (e.g., utilizing a pick-and-place tool), a sintering process is carried-out by the controlled application of heat, pressure, or combination thereof. In various embodiments, a low temperature sintering process may be conducted to transform the deposited bodies of sinter precursor material 28' (FIG. 3) into sintered bond layers 28 (FIG. 4), as indicated by heat lines 78 in FIG. 4. Such a "low temperature" sintering process may be performed during which the peak processing temperatures are maintained below a peak processing temperature $T_{MAX}$. $T_{MAX}$ is preferably less than 300 degrees Celsius (° C.) and, perhaps, less than or equal to about 250° C. in embodiments. In many cases, $T_{MAX}$ will also be significantly less than the melt point of the metal particles contained within sinter precursor material 28' and, perhaps, less than one half the melt point of the particles considered on an absolute temperature scale (in Kelvin). In still further embodiments, $T_{MAX}$ may vary during the sintering process (that is, a multistage heating schedule may be followed), providing that $T_{MAX}$ (in conjunction with the other process parameters) is sufficient to induce sintering of the metal particles without liquefaction thereof. Additionally, in at least some implementations, a controlled convergent pressure may be applied across RF power dies 22 and electrically-conductive base flange 24 during the sintering process. Generally, then, the low temperature sintering process can be carried-out under any process conditions suitable for transforming sinter precursor material 28' (FIG. 3) into sintered bond layers 28 (FIG. 4). The sintering process may be performed with or without pressure, with or without heating (although some degree of elevated heat will typically be applied), and in any suitable atmosphere (e.g., open air or in the presence of an inert gas, such as nitrogen).

Figure 5:
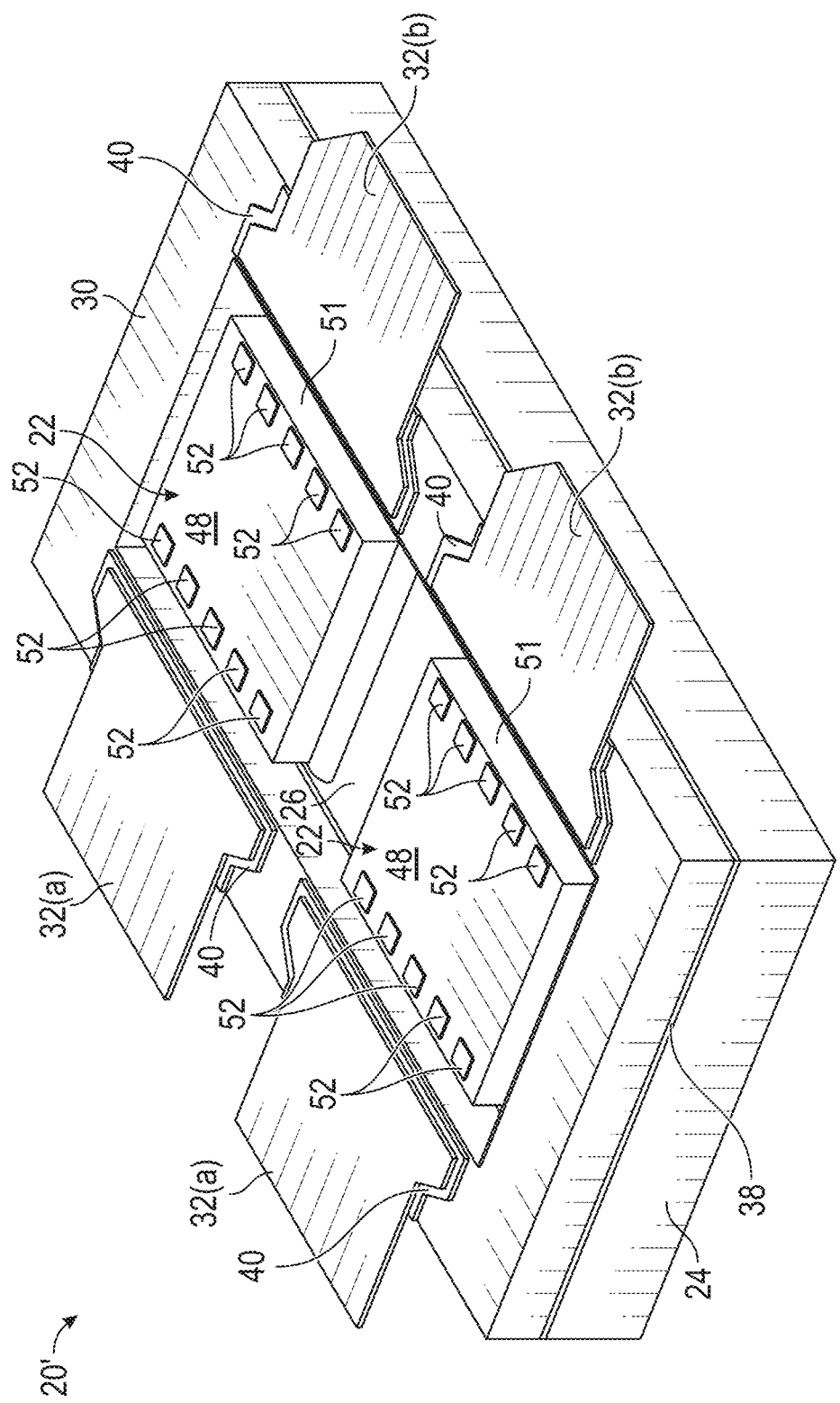

When produced utilizing the above-described metal sintering process, sintered bond layers 28 may be predominately composed of one or more sintered metals. Again, sintered bond layers 28 may or may not contain organic materials. In one embodiment, the sintered bond layers 28 may consist essentially of one or more metals (e.g., essentially pure Ag) and are essentially free of organic material; that is, contain less than 1% weight of organic materials. In other embodiments, the sintered bond layers 28 may contain resin or other organic fillers. For example, in another implementation, sintered bond layers 28 may contain organic materials that increase pliability, such as an epoxy, to reduce the likelihood of crack formation and propagation across thermal cycles. Depending upon the desired final composition of sintered bond layers 28, the parameters of the sintering process may be controlled to decompose organic materials from sinter precursor material 28', in whole or in part Additionally, the sintered bond layers 28 may be produced to have a desired porosity, which may range from 0% to 30% by volume in an embodiment. In another embodiment, the sintered bond layer may be formed to have a porosity of less than 1% and, perhaps, less than 0.5% by volume. Finally, the thickness of sintered bond layers 28 will vary amongst embodiments, but may range from about 5 µm to about 100 µm and, preferably, may range from about 15 µm to about 146 µm in an example and non-limiting embodiment. The resultant structure is depicted in FIG. 5, noting the creation of an open cavity opening away from base flange 24 and into which an encapsulant material is subsequently applied to form peripheral encapsulant bodies 44 as further discussed below.

Figure 6:
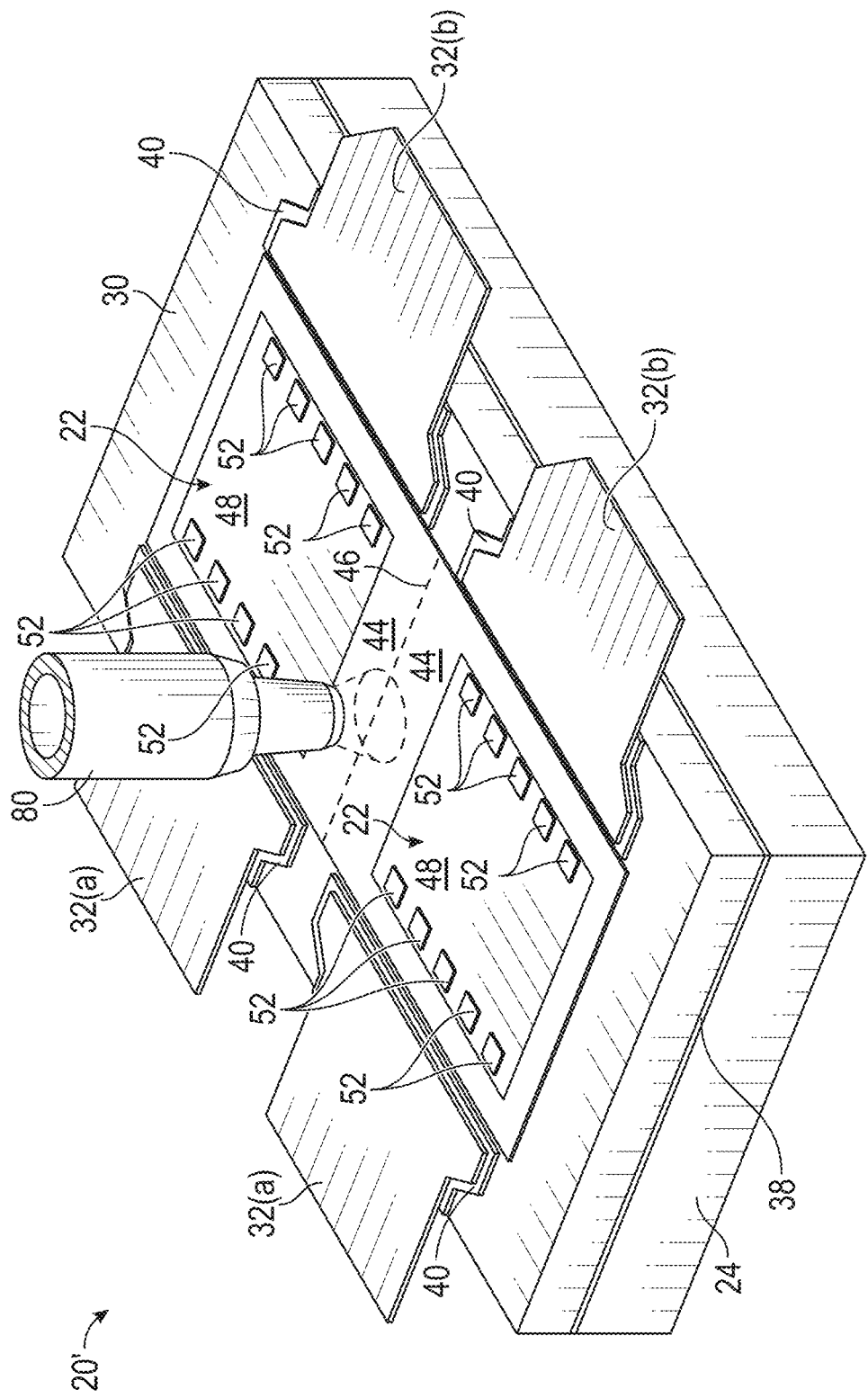

Next, and referring now to FIG. 6, peripheral encapsulant bodies 44 are formed within the interior of partially-fabricated PA package 20' about the respective peripheries of RF power dies 22. In the present example embodiment, a molding or potting process is utilized to concurrently form peripheral encapsulant bodies 44 by dispensing a suitable encapsulant material (e.g., a thermosetting polymer) in a heated, flowable state. Various molding processes may be utilized for this purpose including injection molding and transfer molding techniques. In one approach, a pour molding process is utilized during which an encapsulant material is dispensed into the void space surrounding dies 22 and peripherally bounded by sidewall structure 30 utilizing a dispense tool 80 prior to cover piece attachment or lidding of partially-fabricated PA package 20'. As indicated, such a mold dispense process can be conducted prior to wire bonding in embodiments; however, in other instances, the mold dispense process may be performed following wire bonding if permitted by structure interference concerns. Notably, a pour mold process may allow the selected encapsulant material to flow into the lower open cavity portion of partially-fabricated PA package 20', while being retained by the inner peripheral surfaces of package sidewall structure 30. In contrast to injection molding and transfer molding, such a pour mold process can be conducted without providing an upper mold cavity boundary and without pressurizing the encapsulant material when dispensed, thus easing processing requirements and potentially allowing the mold fill process to be conducted on the same processing surface as are the die attach and/or wire bonding process stages. Regardless of the particular molding technique selected, the encapsulant material may be dispensed in sufficient volume to impart peripheral encapsulant bodies 44 with their desired final dimensions; in the illustrated example, such that the encapsulant material fully covers metal-containing die bond layers 28, contacts the inner periphery of sidewall structure 30, and contacts die peripheral sidewalls 51, but does not encroach onto die frontside 48. Additionally, in the illustrated example, the encapsulant material may flow over and cover the un-occupied area of die support surface 26 of base flange 24 such that the entirety or substantial entirety of die support surface 26 is covered from within gas-containing cavity 36. The encapsulant material is then permitted to cool and set to yield peripheral encapsulant bodies 44.

Following formation of peripheral encapsulant bodies, additional process steps may be performed to complete fabrication of PA package 20. In the illustrated example, such process steps include wire bonding (yielding the structure shown in FIG. 2) and subsequent attachment of cover piece 34 to enclose gas-containing cavity 36 (yielding the completed structure shown in FIG. 1). This results in the fabrication of PA package 20 containing peripherally-encapsulated RF power dies 22 (that is, dies surrounded by peripheral encapsulant bodies 44), while retaining a gas-containing cavity 36 located RF power dies 22 and having a lower surface or floor partly defined or bounded by peripheral encapsulant bodies 44; the terms "upper" and "lower" utilized in relative sense based on proximity to base flange 24. In the above-described manner, peripheral encapsulant bodies 44 are integrated into the PA package design with relatively little, if any modifications and with only modest changes to existing process flows. In further implementations, the above-described package fabrication process can differ in various respects, noting, in particular, that peripheral encapsulant bodies can be formed in various other manners during PA package fabrication. Additional examples of such alternative methods for forming one or more peripheral encapsulant bodies about the periphery of packaged RF power dies will now be described below in connection with FIGS. 7-12. In each of the additional examples set-forth below, reference numerals are carried-over from FIGS. 1-6 where appropriate to denote structure elements or features similar or essentially identical to those previously discussed.

Figure 7:
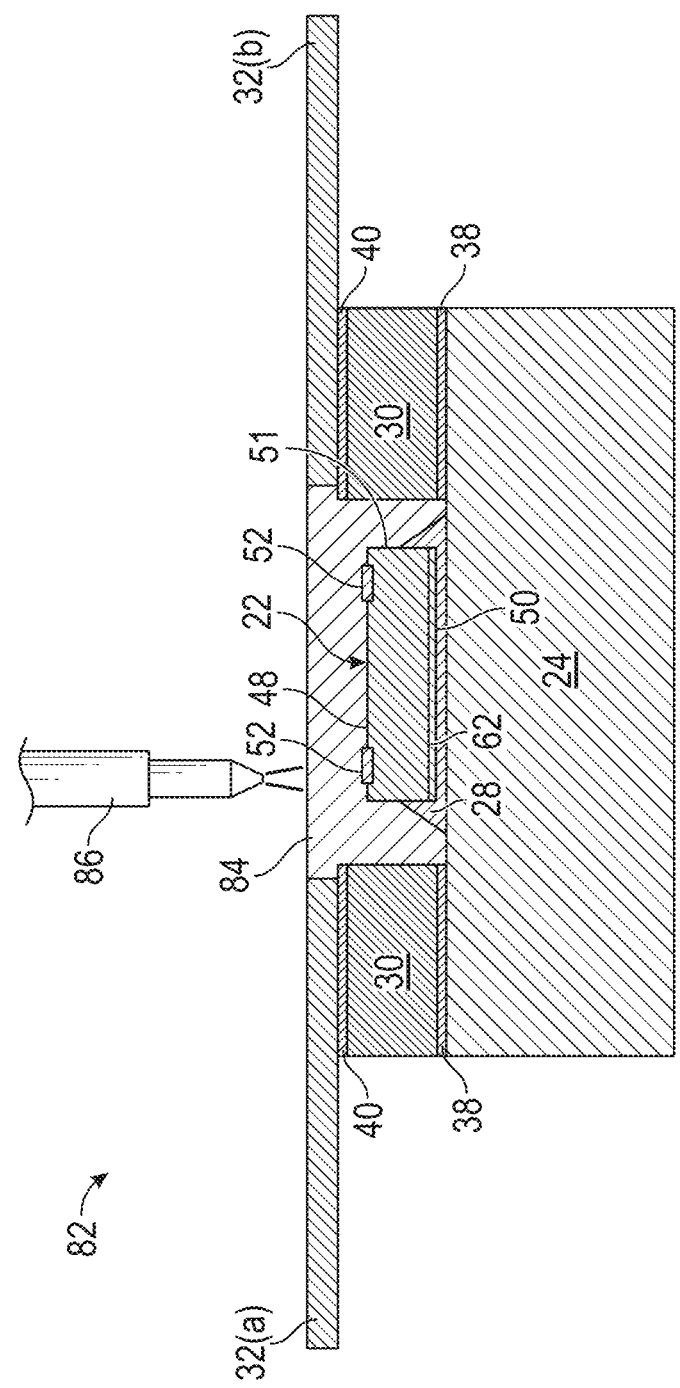
FIGS. 7 and 8 are cross-sectional views of an example PA package shown at intermediate stages of manufacture during which a peripheral encapsulant body is formed about one or more RF power dies utilizing sequentially-performed molding and material removal (e.g., etching) processes in a further example embodiment of the present disclosure.
Figure 8:
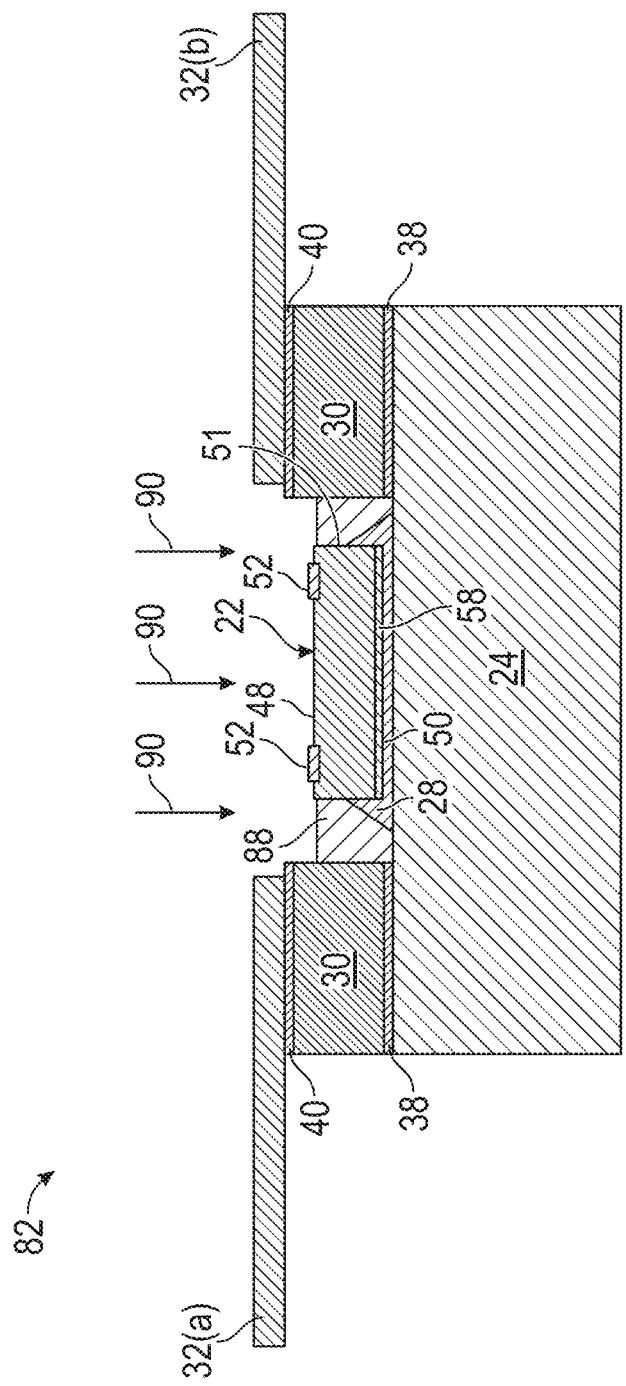

Turning now to FIGS. 7 and 8, a first alternative method is illustrated for forming one or more peripheral encapsulant bodies during fabrication of an example PA package 82, which is shown in simplified cross-section similar to the cross-sectional views of PA package 20 appearing in FIGS. 3 and 4. In this example approach, a potting or molding process is once again employed to dispense a body of encapsulant material 84 into the open cavity of partially-fabricated PA package 82. Encapsulant material 84 is dispensed in sufficient volume to cover metal-containing die bond layers 28 and flow into contact die sidewalls 51. Concurrently, and in a manner similar to the molding process discussed above in connection with FIGS. 5 and 6, the dispensed encapsulant material is retained within the open cavity by package sidewall structure 30, which essentially servers as a dam or retention wall. However, in contrast to the previously molding process, encapsulant material 84 is dispensed to have an excessive thickness or overburden in the example of FIG. 7; and, thus, to initially flow over and onto frontsides 48 of RF power dies 22. After being dispensed in this manner, the encapsulant material is permitted to cool and set Subsequently, and as indicated by arrows 90 in FIG. 8, the excessive encapsulant material or overburden is then removed to yield one or more peripheral encapsulant bodies 88 having the desired final dimensions. Specifically, in the illustrated example, sufficient encapsulant material is removed such that peripheral encapsulant bodies 88 do not encroach onto frontsides 48 of RF power dies 22; and, perhaps, to impart peripheral encapsulant bodies 88 with upper edges that are substantially coplanar with, or located only slightly below (closer to base flange 24), die frontsides 48. Suitable techniques for removing such excessive encapsulant material including wet and dry etching processes, such as microwave plasma and laser etching processes. Such a technique may be beneficially applied when, for example, it is desirably to control the final thickness of peripheral encapsulant bodies 88 within relative tight tolerances, which can be achieved utilizing dry etching processes.

Figure 9:
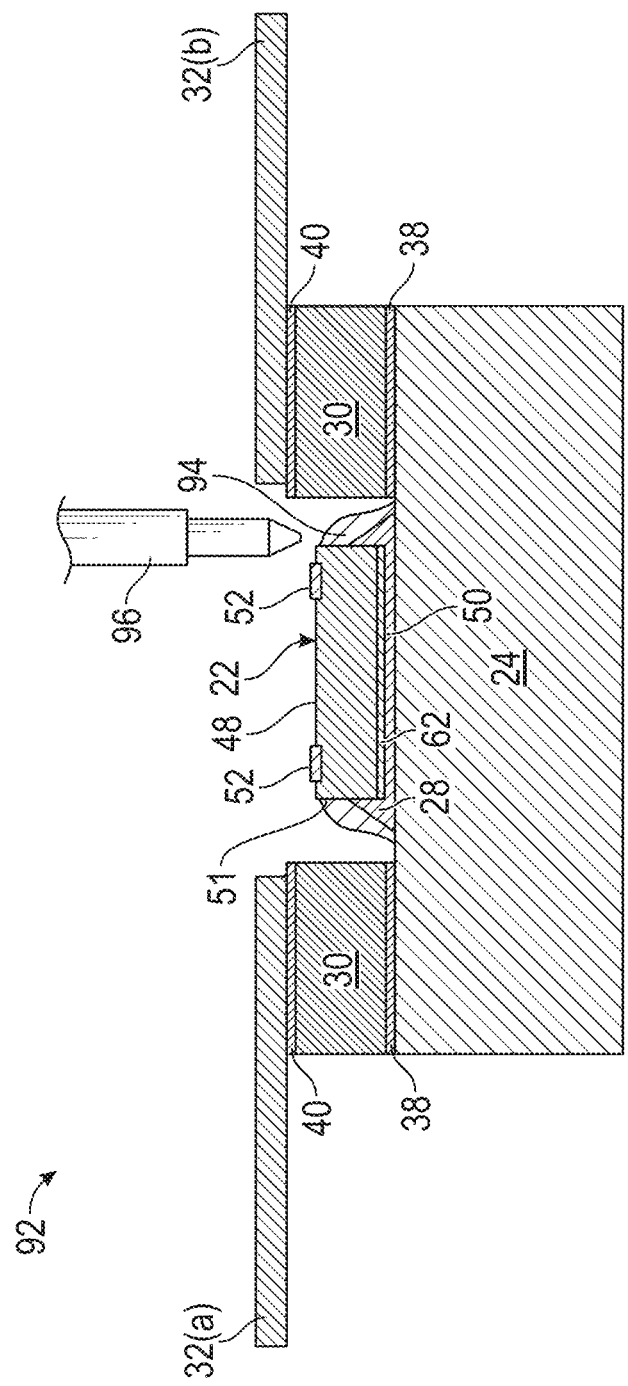
FIGS. 9 and 10 are cross-sectional views of example PA packages shown at intermediate stages of manufacture during which a peripheral encapsulant body is formed about the periphery of one or more RF power dies in a targeted manner utilizing a discrete deposition technique (FIG. 9) or by positioning and bonding of a die-fitting preform (FIG. 10)

In other instances, the peripheral encapsulant bodies may be discretely deposited as annular or ring-shaped structures, which are extend about the peripheries of the RF power dies. In this case, the discrete-deposited annular structures may occupy only a fraction (rather than the entirety) of the lower void space of a given PA package. Further illustrating this approach, FIG. 9 is a cross-sectional view of a partially-fabricated PA package 92 in which a discretely-deposited peripheral encapsulant body 94 has been formed around the outer periphery of the illustrated RF power die 22, contacting die sidewalls 51, and covering metal-containing die bond layer 28. A computer-controlled tool 96 may be utilized to deposit peripheral encapsulant body 94. In certain implementations, computer-controlled tool 96 may be part of larger additive manufacturing machine, such as a three dimensional printing machine, in which case peripheral encapsulant body 94 may be deposited in accordance with a pre-established digital file or virtual (e.g., CAD) model. More commonly, however, computer-controlled tool 96 will assume the form of a fine dispense needle tool or similar dispense tool, which is controlled to direct the selected encapsulant material over and onto die sidewalls 51, metal-containing die bond layer 28, and perhaps the die support surface of base flange 24 during the fabrication process. Depending upon its viscosity and other properties, the encapsulant material may then distribute into the desired shape by adhesion with the contacted surfaces and capillary forces as the encapsulant material gradually cools and sets. Materials suitable for usage in forming such peripheral encapsulant bodies 94 and having sufficient viscosities to permit such deposition include, but are not limited to, glob top materials. The previously-noted properties pertaining to Young's modulus and CTE ranges discussed above in connection with peripheral encapsulant bodies 44 also apply to peripheral encapsulant bodies 94, as well as to the other peripheral encapsulant bodies described herein. Accordingly, peripheral encapsulant bodies 94 may be composed of a material having a Young's modulus ranging from about 5 to about 30 Gpa and a CTE ranging from about 7 to about 25 ppm/° C. in at least some embodiments. Further, as was previously the case, peripheral encapsulant bodies 94 partially bound or define a lower portion of the gas-containing cavity enclosed over RF power die 22 after lidding of PA package 92.

Figure 10:
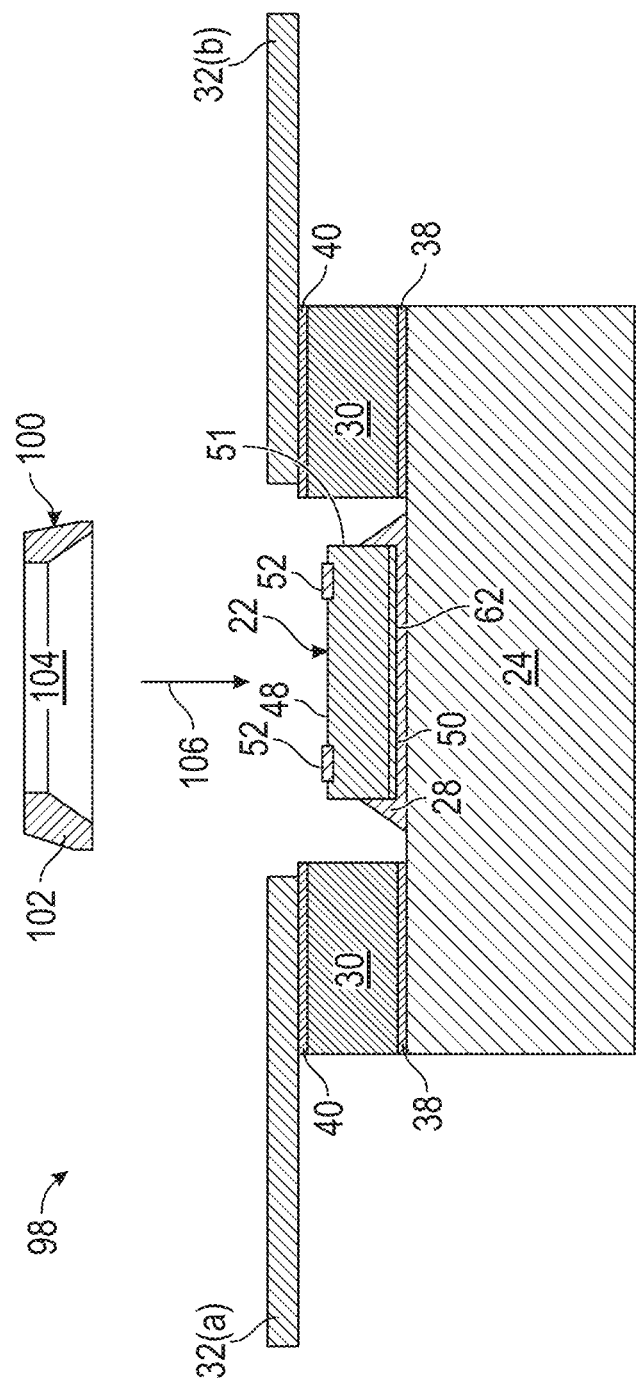

In still other instances, and referring to FIG. 10, one or more peripheral encapsulant bodies may be formed utilizing a preform 100 having a ring-shaped body 102 through which a central opening 104 is provided. In this case, preform 100 may be positioned over metal-containing die bond layer 28 and around RF power die 22, as indicated in FIG. 10 by arrow 106. After fitting about the periphery of RF power die 22, preform 100 may then be subjected to heat and/or pressure to bond preform 100 to die sidewalls 51 and metal-containing die bond layer 28 in instances in which preform 100 is composed of a thermosetting polymer, a solder, or similar material capable of bonding through reflow. In other instances, a bonding material (e.g., pressure sensitive adhesive or die attach material) may be applied onto the interior surfaces of preform 100 to bond preform 100 (or a similar body of material) in place, with preform 100 then serving as the peripheral encapsulant body. When reflowed, bonded in placed, or otherwise sealingly disposed about the outer periphery of RF power die 22 and die bond layer 28 in this manner, preform 100 (here, the peripheral encapsulant body) again helps define a lower floor portion of the gas-containing cavity created when bonding a cover piece over the lower portion (the die-substrate assembly) of PA package 98, such as cover piece 34 shown in FIG. 1.

Figure 11:
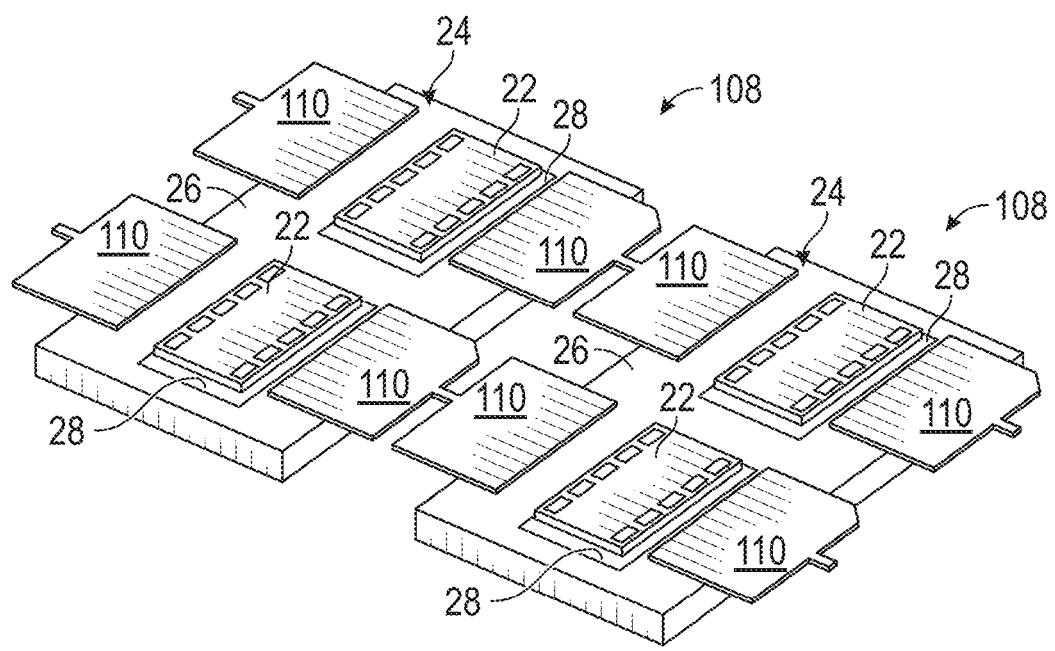
FIGS. 11 and 12 are isometric views of two PA packages (included in a larger interconnected package array) shown at intermediate stages of manufacture during which a global overmold process is utilized to concurrently form the package sidewalls and the peripheral encapsulant bodies, as illustrated in accordance with a further embodiment of the present disclosure.
Figure 12:
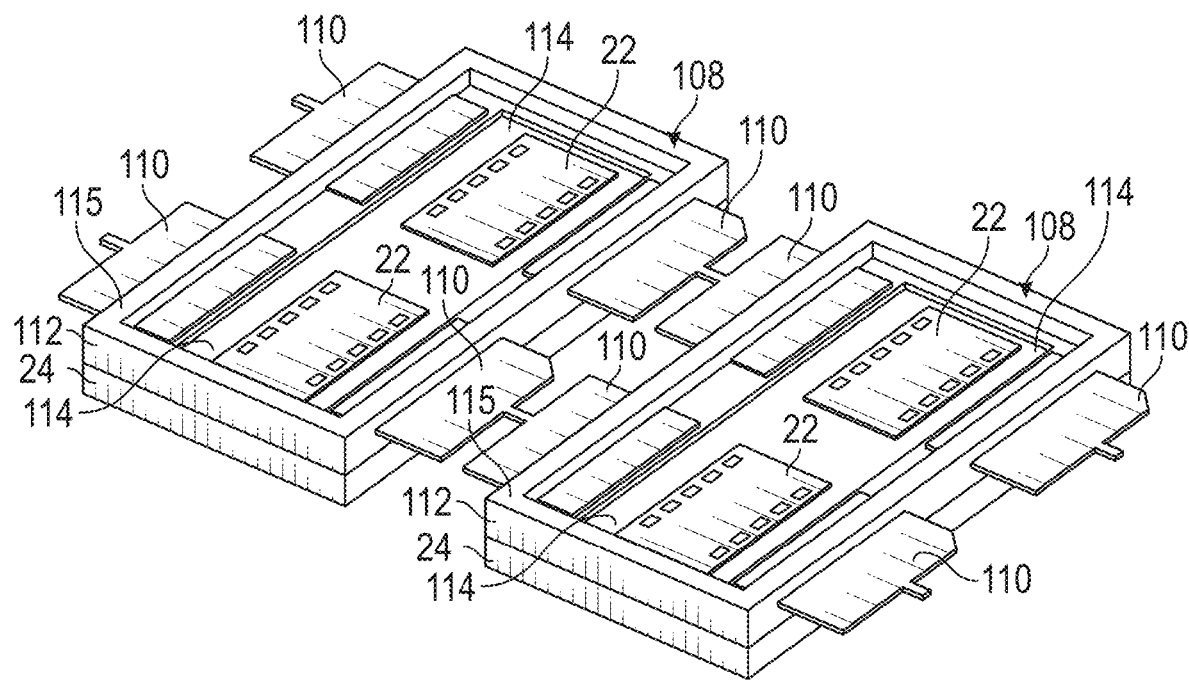

While the above-described examples principally focus on processing a single PA package to produce the peripheral encapsulant bodies, it will be appreciated that the above-described fabrication process can be performed on a larger (panel- or strip-level) scale to concurrently produce a relatively large number of PA packages in parallel for enhanced process efficiency. Additionally, in at least some cases, certain global molding process may be utilized to concurrently form the package sidewall structures in combination with the peripheral encapsulant bodies as a single or integral mass of material. Further emphasizing this latter point, FIGS. 11 and 12 illustrate two conjoined PA packages 108 during an intermediate stage of manufacture and included in a larger, non-illustrated array of such packages. At the stage of manufacture shown in FIG. 11, RF power dies 22 have been bonded to die support surfaces 26 of base flanges 24 utilizing metal-containing die bond layers 28, such as sintered Ag bond layers or another metal-containing (e.g., Ag- or Au-containing) bond layer, as previously described. In this example, package leads 110 have been provided in the form of a larger leadframe (only a small portion of which is shown for clarity) and thus remain interconnected at the present stage of manufacture, which occurs prior to singulation. The leadframe may be retained in place by a non-illustrated fixture such that a vertical gap or spacing exists between the underside of leads 110 and base flanges 24. Overmolding is subsequently conducted to form molded bodies 112 including package sidewall structures 115 securing leads 110 to base flanges 24, thereby permitting leadframe singulation at a subsequent stage of manufacture. In this example, the overmolding process is performed to concurrently produce peripheral encapsulant bodies 114 surrounding each RF power die 22 in conjunction with package sidewall structures 115; e.g., as was previously the case, each peripheral encapsulant body 114 may contact the sidewalls of its corresponding RF power die 22, fully cover the underlying metal-containing die bond layer 28, and have an uppermost surface or edge located closer to the frontside of the RF power die 22 than to the frontside or die support surface 26 of the base flange 28. Additional process steps, including cover piece attachment and singulation, are then carried-out to complete fabrication of PA packages 108.

Example Testing Results

Figure 13:
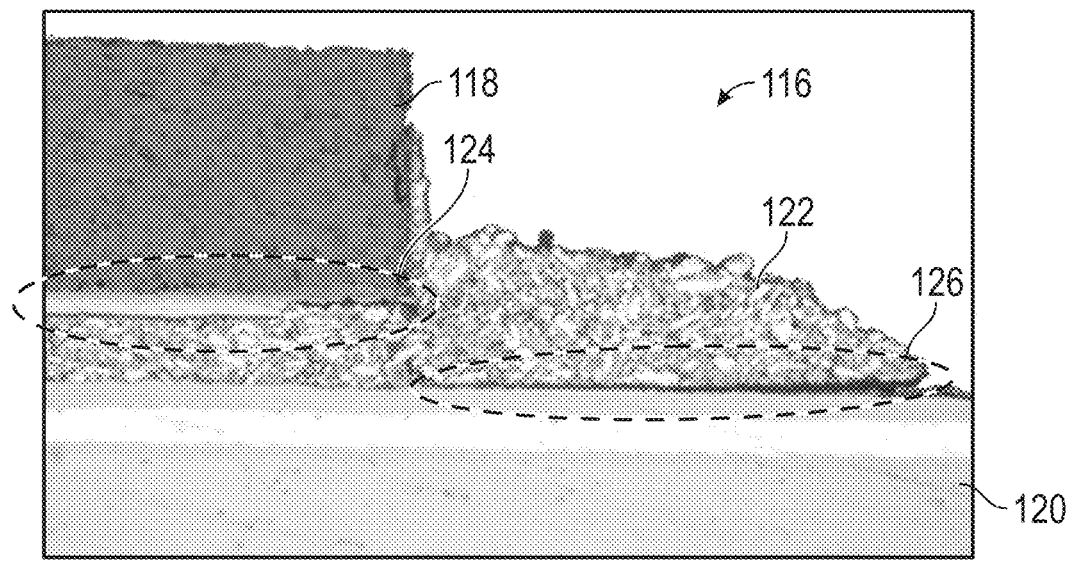
FIGS. 13 and 14 are cross-sectional test images demonstrating die bond delamination occurring in the case of a first air cavity PA package (FIG. 13) lacking a peripheral encapsulant body, as contrasted against the absence of die bond delamination in a comparable PA package (FIG. 14) including a peripheral encapsulant body surrounding an RF power die and fabricated in accordance with the present teachings.
Figure 14:
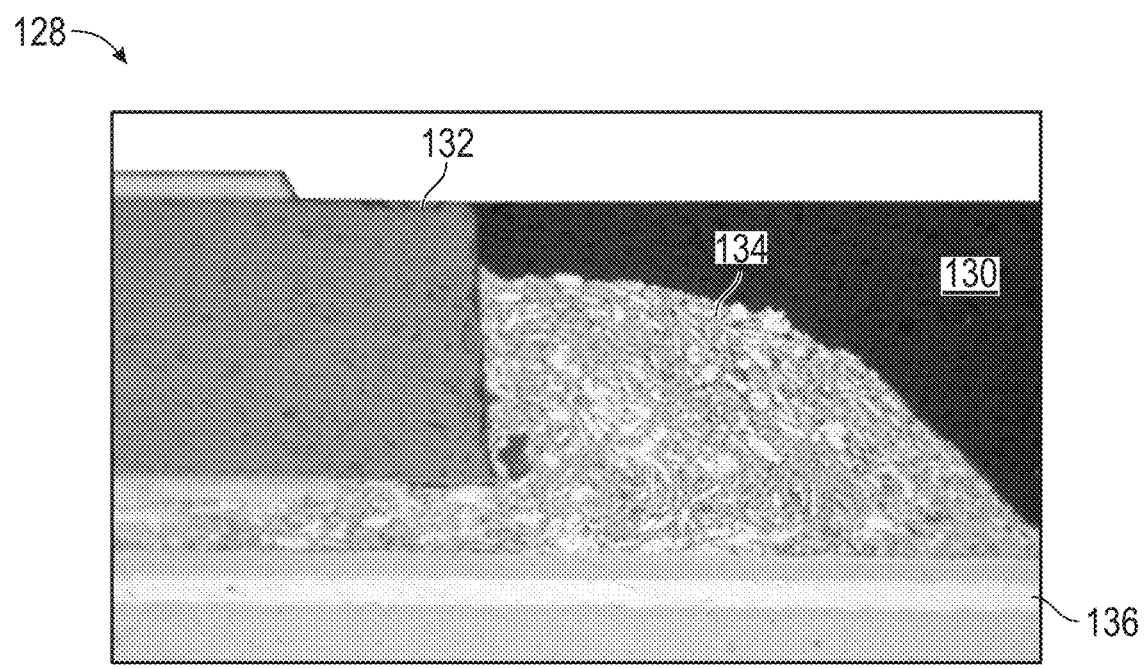

Physical testing was performed demonstrating the effectiveness of incorporating peripheral encapsulant bodies into PA package designs to mitigate die bond layer delamination and dendrite growth under simulated extreme operating conditions. Addressing first die bond layer delamination, FIGS. 13 and 14 are magnified cross-sections of test samples subjected to repeated thermal cycling in the presence of moisture. Specifically, in this case, the test samples were subjected to six hundred and fifty thermal cycles at a rate of two cycles an hour and over a temperature of −40° C. to 125° C. Test sample 116, shown in FIG. 13, includes an RF power die 118 bonded to a metallic base flange 120 via a metal-containing die bond layer 122, which is predominately composed of sintered Ag by weight. As can be seen, delamination has occurred at multiple junctures in the case of test sample 116, both at an interface between the backside of RF power die 118 and die bond layer 122 (identified by dashed circle 124) and at an interface between die bond layer 122 and base flange 120 (identified by dashed circle 126). Comparatively, test sample 128 shown in FIG. 14 includes a peripheral encapsulant body 130 analogous to peripheral encapsulant bodies 44 described above in connection with FIGS. 1-6. As can be seen, essentially zero die bond delamination has occurred at the interfaces between RF power die 132, die bond layer 134 (again predominately composed of sintered Ag), and base flange 136 following the above-described thermal cycling process.

Figure 15:
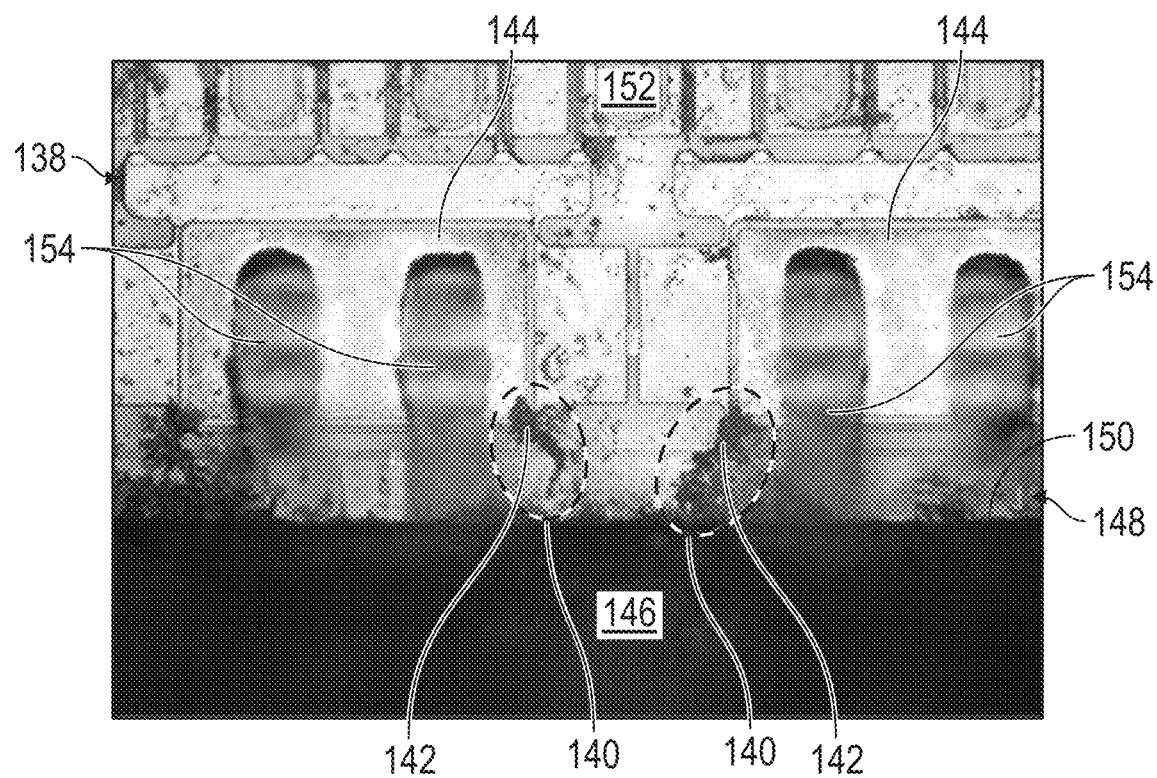
FIGS. 15 and 16 are planform test images depicting problematic dendrite growth occurring in the case of a first air cavity PA package (FIG. 15) including a sintered silver (Ag) die bond layer, but lacking a peripheral encapsulant body, relative to the absence of dendrite growth in a comparable PA package (FIG. 16) including a peripheral encapsulant body covering a sintered Ag die bond layer (hidden from view) and further produced in accordance with the present teachings.
Figure 16:
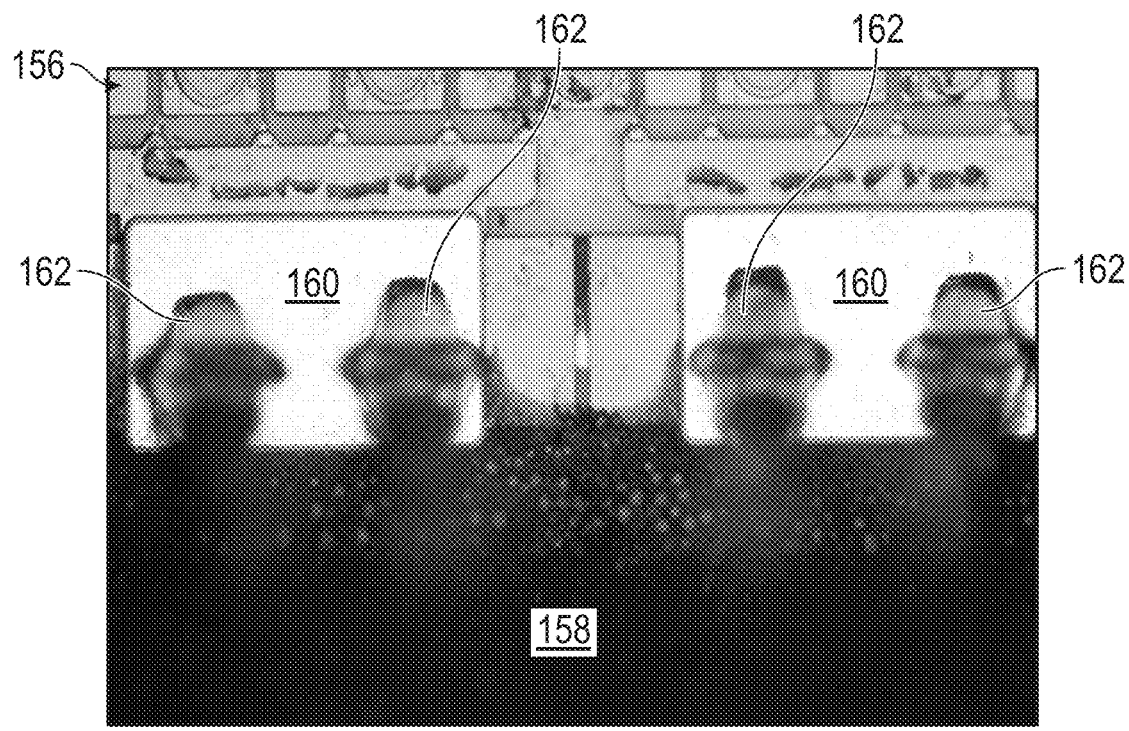

Similarly, as indicated in FIG. 15, dendrite growth is observed for a test sample 138 lacking a peripheral encapsulant body and subject to testing conditions mimicking device operation in the presence of moisture ingress into the air cavity. By referring to dashed circles 140 in FIG. 15, it can be seen that dendrites 142 have formed and extend from bond pads 144 toward metal-containing die bond layer 146, which attached a die 148 having an edge 150 to an underlying substrate. Other structures observed in this figure include FET features 152 and bond wires 154. In contrast, and referring to FIG. 16, no dendrite growth is observed for a comparable test sample 156 subject to identical testing parameters, while including a peripheral encapsulant body 158. Note, in particular, the absence of such dendrite formation about the periphery of bond pads 160 to which wire bonds 162 are joined. The die bond layer attaching the illustrated die to the base flange (hidden from view) cannot be seen in FIG. 16 due to the presence of peripheral encapsulant body 158, but is composed of a sintered Ag material essentially identical to die bond layer 146 of test sample 138 (FIG. 15).

CONCLUSION

There has thus been provided embodiments of a PA package including a gas-containing cavity and one or more RF power dies, which are peripherally-surrounded by peripheral encapsulant bodies. Due to the incorporation of the peripheral encapsulant bodies into the PA package construction, the likelihood of die bond layer delamination is greatly reduced, including in instances in which a given RF power die possesses a relatively high stiffness and there exists a relatively large CTE differential between the RF power die and the underlying package substrate. Concurrently, the peripheral encapsulant body or bodies within a given PA package form a physical barrier surrounding the bonded die structure(s), which impede undesired electrochemical reactions between the (e.g., metal-containing) die bond layer attaching each RF power die to the underlying substrate and any moisture contaminant accumulating within the gas-containing cavity of the PA package over time. Similarly, concerns regarding dendrite growth (or excessive tarnish) when the die support surface of the package substrate is at least partly composed of a metallic constituent prone to dendrite growth reactions may also be reduced or eliminated via provision of the above-described peripheral encapsulant bodies; e.g., as may be beneficial when the package substrate assumes the form of a metallic base flange having an Ag-containing plated upper surface prone to dendrite growth reactions in the presence of moisture. The end result in a PA package having optimized RF performance and heat dissipation characteristics, while further having an improved reliability over an extended operational lifespan due to mitigation of while concerns regarding the above-described failure modes (die bond layer delamination and dendritic growth failure modes).

In embodiments, a method for fabricating a PA package includes the step or process of obtaining a die-substrate assembly including a RF power die, a package substrate, and a die bond layer attaching the RF power die to the package substrate. The die bond layer is composed of at least one metallic constituent and electrically couples a backside of the RF power die to the package substrate during operation of the PA package. A peripheral encapsulant body is formed around the RF power die and covers at least a portion of the die bond layer, while leaving at least a majority of a frontside of the RF power die uncovered by the peripheral encapsulant body. Before or after forming the peripheral encapsulant body, terminals of the PA package are interconnected with the RF power die. After forming the peripheral encapsulant body and interconnecting the terminals of the PA package with the RF power die, a cover piece is bonded to the die-substrate assembly to enclose a gas-containing cavity within the PA package. The gas-containing cavity is partially bound, bordered, or defined by the frontside of the RF power die, the peripheral encapsulation body, or both. Similarly, in embodiments, at least a portion, if not the substantial entirety of the frontside of the RF power die is exposed to the gas-containing cavity within the PA package. Further, in at least some implementations, the step of forming includes forming the peripheral encapsulant body to contact at least a majority of a cumulative sidewall surface area of the RF power die, taken alone or in combination with the die bond layer.

In further embodiments, a method for fabricating a PA package includes the steps or processes of: (i) obtaining a die-substrate assembly including a first RF power die having die sidewalls, a package substrate having a die support surface, and a die bond layer attaching the RF power die to the die support surface of the package substrate; (ii) forming a first peripheral encapsulant body around the first RF power die, in contact with the die sidewalls, in contact with the die support surface, and covering the die bond layer; (iii) before or after forming the first peripheral encapsulant body, interconnecting terminals of the PA package with the first RF power die; and (iv) enclosing a gas-containing cavity within the PA package after forming the first peripheral encapsulant body and interconnecting the terminals of the PA package with the first RF power die, the gas-containing cavity having a floor partially bounded by the first peripheral encapsulant body.

In still further embodiments, a PA package includes a package substrate having a die support surface, an RF power die, and a metal-containing die bond layer. The RF power die has die sidewalls, a die frontside, and a die backside opposite the die frontside, with the die backside facing the die support surface of the package substrate. The metal-containing die bond layer bonds the backside of the RF power die to the die support surface of the package substrate. A peripheral encapsulant body is formed around the RF power die. The peripheral encapsulant body extends toward the die frontside and over a juncture formed between the metal-containing die body layer and die sidewalls, while terminating prior to reaching the die frontside. A cover piece is bonded over package substrate to enclose a gas-containing cavity, which is at least partially defined or bordered by the cover piece, the peripheral encapsulant body, and the metal-containing die bond layer.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like may have been used above in accordance with the order in which certain elements were introduced during the course of the foregoing Detailed Description Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A method for fabricating a power amplifier (PA) package, comprising:
   obtaining a die-substrate assembly including a radio frequency (RF) power die, a package substrate, and a die bond layer attaching the RF power die to the package substrate, the die bond layer composed of at least one metallic constituent and electrically coupling a backside of the RF power die to the package substrate during operation of the PA package;
   forming a peripheral encapsulant body around the RF power die and covering at least a portion of the die bond layer, while leaving at least a majority of a frontside of the RF power die uncovered by the peripheral encapsulant body;
   before or after forming the peripheral encapsulant body, interconnecting terminals of the PA package with the RF power die; and
   bonding a cover piece to the die-substrate assembly to enclose a gas-containing cavity within the PA package after forming the peripheral encapsulant body and interconnecting the terminals of the PA package with the RF power die, the gas-containing cavity partially bound by the frontside of the RF power die.

2. The method of claim 1, wherein forming comprises forming the peripheral encapsulant body to extend over an upper terminal edge of the die body layer and toward the die frontside, while terminating prior to encroachment onto the die frontside.

3. The method of claim 1, wherein the RF power die comprises die sidewalls having a cumulative sidewall surface area; and
   wherein the forming comprises forming the peripheral encapsulant body to contact at least a majority of the cumulative sidewall surface area of the RF power die, taken alone or in combination with the die bond layer.

4. The method of claim 3, wherein the RF power die is attached to a die support surface of the package substrate;
   wherein the die-substrate assembly comprises a sidewall structure extending around an outer peripheral portion of the die support surface;
   wherein the sidewall structure, the die sidewalls, the dies support surface of the package substrate, and the die bond layer define a cavity opening away from the package substrate; and
   wherein forming comprises applying an encapsulant material into the open cavity to form the peripheral encapsulant body.

5. The method of claim 4, wherein applying comprises dispensing a flowable encapsulant material into the open cavity to form the peripheral encapsulant body in contact with interior surfaces the sidewall structure and to cover exposed regions of die support surface.

6. The method of claim 1, further comprising selecting the die bond layer to contain non-trace amounts of silver.

7. The method of claim 6, wherein selecting comprises selecting the die bond layer to be predominately composed of sintered silver, by weight.

8. The method of claim 1, wherein the package substrate has a first coefficient of thermal expansion (CTE); and
   wherein forming comprises forming the peripheral encapsulant body from a material having (i) a second CTE equal to the first CTE plus or minus 10 parts per million per degrees Celsius and (ii) a Young's modulus between 10 and 30 Gigapascals.

9. The method of claim 1, further comprising selecting the RF power die to comprise:
   a die body partially composed of at least one of gallium nitride and gallium arsenide; and
   a power amplifier transistor at least partially formed in the die body and having a source terminal electrically coupled to the package substrate through the die bond layer.

10. The method of claim 1, wherein forming comprises forming the peripheral encapsulant body to extend from the package substrate, over the die bond layer, and to the RF power die such that the peripheral encapsulant body covers the substantial entirety of the metal-containing die bond layer.

11. The method of claim 1, wherein the RF power die is attached to a die support surface of the package substrate; and
   wherein forming comprises forming the encapsulant body to have an upper terminal edge located closer to the frontside of the RF power than to the die support surface of the package substrate.

12. The method of claim 1, wherein interconnecting comprises forming wire bonds extending from bond pads on the RF power die, over the peripheral encapsulant body, and to terminals of the PA package, the peripheral encapsulant body having a non-contacting relationship with the wire bonds.

13. A method for fabricating a power amplifier (PA) package, comprising:
   obtaining a die-substrate assembly including a first radio frequency (RF) power die having die sidewalls, a package substrate having a die support surface, and a die bond layer attaching the RF power die to the die support surface of the package substrate;
   forming a first peripheral encapsulant body around the first RF power die, in contact with the die sidewalls, in contact with the die support surface, and covering the die bond layer;
   before or after forming the first peripheral encapsulant body, interconnecting terminals of the PA package with the first RF power die; and enclosing a gas-containing cavity within the PA package after forming the first peripheral encapsulant body and interconnecting the terminals of the PA package with the first RF power die.

14. The method of claim 13, wherein the die-substrate assembly further comprises a second RF power die bonded to the die support surface of the package substrate; and
wherein the method further comprises forming a second peripheral encapsulant body around the second RF power die concurrently with forming the first peripheral encapsulant body around the first RF power die.

15. A power amplifier (PA) package, comprising:
a package substrate having a die support surface;
a radio frequency (RF) power die having die sidewalls, a die frontside, and a die backside opposite the die frontside, the die backside facing the die support surface of the package substrate;
a metal-containing die bond layer bonding the backside of the RF power die to the die support surface of the package substrate;
a peripheral encapsulant body formed around the RF power die, the peripheral encapsulant body extending toward the die frontside and over a juncture formed between the metal-containing die body layer and die sidewalls, while terminating prior to reaching the die frontside; and
a cover piece bonded over package substrate to enclose a gas-containing cavity, the gas-containing cavity at least partially bound by the cover piece, the peripheral encapsulant body, the metal-containing die bond layer, and the die frontside of the RF power die.

16. The PA package of claim 15, wherein the metal-containing die bond layer is predominately composed of sintered sliver, by weight.

17. The PA package of claim 15, wherein the peripheral encapsulant body has an upper edge located closer to the die frontside than to the die-support surface of the package substrate, as taken along an axis orthogonal to the die-support surface.

18. The PA package of claim 15, wherein the peripheral encapsulant body and the metal-containing die bond layer, taken in combination, are bonded to at least a majority of the die sidewalls by surface area.

19. The PA package of claim 15, wherein the peripheral encapsulant body covers the die bond layer in its substantial entirety.

20. The PA package of claim 15, wherein the package substrate comprises a base flange electrically coupled to the backside of the RF power die through the metal-containing die bond layer;
wherein the base flange has a first coefficient of thermal expansion (CTE); and
wherein peripheral encapsulant body is composed of a material having (i) a second CTE equal to the first CTE plus or minus 10 parts per million per degrees Celsius and (ii) a Young's modulus between 5 and 30 Gigapascals.

* * * * *